(12) United States Patent
Srinivasan et al.

(10) Patent No.: US 8,880,571 B2
(45) Date of Patent: Nov. 4, 2014

(54) HIGH DYNAMIC RANGE DATA FORMAT CONVERSIONS FOR DIGITAL MEDIA

(75) Inventors: Sridhar Srinivasan, Redmond, WA (US); Zhi Zhou, Issaquah, WA (US)

(73) Assignee: Microsoft Corporation, Redmond, WA (US)

( * ) Notice: Subject to any disclaimer, the term of this patent is extended or adjusted under 35 U.S.C. 154(b) by 990 days.

(21) Appl. No.: 11/418,627

(22) Filed: May 5, 2006

(65) Prior Publication Data

US 2007/0258641 A1    Nov. 8, 2007

(51) Int. Cl.
```
G06F 7/00      (2006.01)
G06F 15/00     (2006.01)
H04N 1/60      (2006.01)
H03M 7/24      (2006.01)
H04N 1/407     (2006.01)
```

(52) U.S. Cl.
CPC .............. *H03M 7/24* (2013.01); *H04N 1/6027* (2013.01); *H04N 1/407* (2013.01)
USPC ........................................ 708/200; 708/204

(58) Field of Classification Search
CPC .... H04N 19/00472; H03M 7/24; G06F 7/483
USPC ................ 708/204; 712/222; 382/232–233
See application file for complete search history.

(56) References Cited

U.S. PATENT DOCUMENTS

| | | | |
|---|---|---|---|
| 4,511,990 A * | 4/1985 | Hagiwara et al. | 708/501 |
| 4,583,180 A * | 4/1986 | Kmetz | 708/204 |
| 4,626,825 A * | 12/1986 | Burleson et al. | 341/75 |
| 4,831,575 A * | 5/1989 | Kuroda | 708/204 |
| 5,257,215 A * | 10/1993 | Poon | 708/204 |
| 5,414,469 A | 5/1995 | Gonzales et al. | |
| 5,465,118 A | 11/1995 | Hancock et al. | |
| 5,467,134 A | 11/1995 | Laney et al. | |

(Continued)

FOREIGN PATENT DOCUMENTS

| | | |
|---|---|---|
| EP | 0600613 | 6/1994 |
| EP | 0 692 915 | 1/1996 |

(Continued)

OTHER PUBLICATIONS

Paul et al., "Stabilizing Mantissa Rates in Feedback Systems with Floating-point Quantization and Time-variant Delays", 2004, IEEE 47th Symposium on Circuits and Systems, p. 501-404.*

Andreas Ehliar and Johan Eilert, A hardware MP3 decoder with low precision floating point intermediate storage, Linkoping 2003, pp. 1-121.*

(Continued)

*Primary Examiner* — Chuong D Ngo
*Assistant Examiner* — Kevin G Hughes
(74) *Attorney, Agent, or Firm* — Micah Goldsmith; Glen Johnson; Micky Minhas

(57) ABSTRACT

One or more continuous mappings are defined at a digital media encoder to convert input digital media data in a first high dynamic range format to a second format with a smaller dynamic range than the first format. The encoder converts the input digital media data to the second format with the smaller dynamic range using the continuous mapping and one or more conversion parameters relating to the continuous mapping. The encoder encodes the converted digital media data in a bitstream along with the conversion parameter(s). The conversion parameter(s) enable a digital media decoder to convert the converted digital media data back to the first high dynamic range format from the second format with the smaller dynamic range. Techniques for converting different input formats with different dynamic ranges are described.

27 Claims, 11 Drawing Sheets

(56) References Cited

U.S. PATENT DOCUMENTS

| | | |
|---|---|---|
| 5,544,286 A | 8/1996 | Laney |
| 5,611,038 A | 3/1997 | Shaw et al. |
| 5,699,124 A | 12/1997 | Nuber et al. |
| 5,737,023 A | 4/1998 | Linzer |
| 5,764,296 A | 6/1998 | Shin |
| RE35,910 E | 9/1998 | Nagata et al. |
| 5,801,975 A * | 9/1998 | Thayer et al. ............... 708/402 |
| 5,805,914 A * | 9/1998 | Wise et al. .................. 382/232 |
| 5,821,986 A | 10/1998 | Yuan et al. |
| 5,828,421 A | 10/1998 | Boyce et al. |
| 5,864,637 A | 1/1999 | Liu et al. |
| 5,933,360 A * | 8/1999 | Larson ........................ 708/512 |
| 5,970,173 A | 10/1999 | Lee et al. |
| 5,995,122 A * | 11/1999 | Hsieh et al. ................. 345/561 |
| 6,002,801 A | 12/1999 | Strongin et al. |
| 6,061,782 A * | 5/2000 | Elliott et al. ................. 712/222 |
| 6,104,434 A | 8/2000 | Nakagawa et al. |
| 6,115,031 A | 9/2000 | Love |
| 6,151,612 A * | 11/2000 | Song ............................ 708/204 |
| 6,181,823 B1 * | 1/2001 | Takahashi .................... 382/232 |
| 6,239,815 B1 | 5/2001 | Frink et al. |
| 6,256,347 B1 | 7/2001 | Yu et al. |
| 6,259,741 B1 | 7/2001 | Chen et al. |
| 6,259,810 B1 | 7/2001 | Gill et al. |
| 6,389,071 B1 | 5/2002 | Wilson |
| 6,396,422 B1 | 5/2002 | Barkan |
| 6,418,166 B1 | 7/2002 | Wu et al. |
| 6,438,317 B1 * | 8/2002 | Imahashi et al. ............. 386/239 |
| 6,483,938 B1 | 11/2002 | Hennessey et al. |
| 6,499,060 B1 | 12/2002 | Wang et al. |
| 6,510,177 B1 | 1/2003 | De Bonet et al. |
| 6,519,288 B1 | 2/2003 | Vetro et al. |
| 6,600,785 B1 | 7/2003 | Nishigori et al. |
| 6,606,418 B2 | 8/2003 | Mitchell et al. |
| 6,697,530 B2 * | 2/2004 | Kenyon et al. ............... 382/239 |
| 6,728,317 B1 | 4/2004 | Demos |
| 6,778,711 B2 | 8/2004 | Morita |
| 6,823,014 B2 | 11/2004 | Kim |
| 6,831,951 B2 | 12/2004 | Yamada |
| 6,909,459 B2 * | 6/2005 | Watson et al. ............. 348/229.1 |
| 6,937,291 B1 | 8/2005 | Gryskiewicz |
| 6,944,357 B2 * | 9/2005 | Bossut et al. ................. 382/298 |
| 7,110,610 B2 | 9/2006 | Malvar |
| 7,155,055 B2 | 12/2006 | Malvar |
| 7,242,717 B2 | 7/2007 | Li et al. |
| 7,330,864 B2 * | 2/2008 | Yuval et al. .................. 708/208 |
| 7,492,950 B2 | 2/2009 | Suzuki et al. |
| 7,548,245 B2 | 6/2009 | Evans et al. |
| 7,586,985 B2 | 9/2009 | Park et al. |
| 7,639,265 B2 | 12/2009 | Evans et al. |
| 7,649,539 B2 | 1/2010 | Evans et al. |
| 2001/0025292 A1 | 9/2001 | Denk et al. |
| 2002/0009143 A1 | 1/2002 | Arye |
| 2002/0034376 A1 * | 3/2002 | Katayama et al. ............. 386/96 |
| 2002/0064226 A1 | 5/2002 | Bauer et al. |
| 2002/0145610 A1 * | 10/2002 | Barilovits et al. ............. 345/538 |
| 2002/0154693 A1 | 10/2002 | Demos et al. |
| 2002/0186890 A1 | 12/2002 | Lee et al. |
| 2003/0044076 A1 | 3/2003 | Mitchell et al. |
| 2003/0118114 A1 * | 6/2003 | Penna ....................... 375/240.25 |
| 2003/0122942 A1 * | 7/2003 | Parker et al. ............... 348/231.3 |
| 2003/0128893 A1 | 7/2003 | Castorina |
| 2003/0151610 A1 | 8/2003 | Kuriakin et al. |
| 2003/0169814 A1 * | 9/2003 | Fu et al. .................... 375/240.12 |
| 2003/0202589 A1 | 10/2003 | Reitmeier |
| 2003/0210821 A1 * | 11/2003 | Yogeshwar et al. .......... 382/232 |
| 2004/0008790 A1 | 1/2004 | Rodriguez |
| 2004/0042549 A1 | 3/2004 | Huang et al. |
| 2004/0131260 A1 * | 7/2004 | Mekuria ....................... 382/232 |
| 2004/0183949 A1 | 9/2004 | Lundberg et al. |
| 2004/0184657 A1 | 9/2004 | Lin et al. |
| 2004/0190771 A1 | 9/2004 | Eid et al. |
| 2004/0213345 A1 | 10/2004 | Holcomb et al. |
| 2004/0218678 A1 | 11/2004 | Tardif |
| 2005/0013373 A1 | 1/2005 | Lin et al. |
| 2005/0030422 A1 | 2/2005 | Leone et al. |
| 2005/0041878 A1 | 2/2005 | Schwartz et al. |
| 2005/0047676 A1 | 3/2005 | Kang |
| 2005/0063471 A1 | 3/2005 | Regunathan et al. |
| 2005/0069039 A1 * | 3/2005 | Crinon ..................... 375/240.26 |
| 2005/0089239 A1 | 4/2005 | Brajovic |
| 2005/0123283 A1 | 6/2005 | Li |
| 2005/0200630 A1 | 9/2005 | Evans et al. |
| 2005/0243176 A1 | 11/2005 | Wu et al. |
| 2006/0007502 A1 | 1/2006 | Debevec et al. |
| 2007/0036225 A1 | 2/2007 | Srinivasan et al. |
| 2007/0076971 A1 * | 4/2007 | Roimela et al. ............... 382/251 |
| 2007/0160134 A1 | 7/2007 | Segall |
| 2007/0237391 A1 * | 10/2007 | Wu ............................... 382/166 |
| 2007/0258641 A1 | 11/2007 | Srinivasan et al. |
| 2007/0296732 A1 | 12/2007 | Evans et al. |
| 2007/0296861 A1 | 12/2007 | Evans et al. |
| 2008/0019449 A1 | 1/2008 | Lin et al. |
| 2008/0198936 A1 | 8/2008 | Srinivasan et al. |

FOREIGN PATENT DOCUMENTS

| | | |
|---|---|---|
| JP | 4-207684 | 7/1992 |
| JP | 08-163562 | 6/1996 |
| JP | 2000-165866 | 6/2000 |
| JP | 2006-279741 | 10/2006 |
| RU | 2005107478 | 7/2006 |
| RU | 2321063 | 3/2008 |
| TW | 545057 | 8/2003 |
| WO | WO 99/59329 | 11/1999 |
| WO | WO 00/33581 | 6/2000 |
| WO | WO 01/95633 | 12/2001 |

OTHER PUBLICATIONS

Johan Eilert Andreas Ehliar Dake Liu, Using Low Precision Floating Point Numbers to Reduce Memory Cost for MP3 Decoding, 2004 IEEE 6th Workshop on Multimedia Signal Processing, pp. 119-122.*

Wikipedia the free encyclopedia, Syntax highlighting, Mar. 25, 2012, pp. 1-4.*

Agnoli, "QuickTime Pixel Format FourCCs," 5 pp. [Downloaded from the World Wide Web on Feb. 9, 2004].

Apple Computer, Inc., "Color Packing for Color Spaces (IM: ACI Ref)," 2 pp. [Downloaded from the World Wide Web on Feb. 9, 2004].

Apple Computer, Inc., "ColorSync Manager Reference: Color Packing for Color Spaces," 3 pp. [Downloaded from the World Wide Web on Feb. 9, 2004].

FOURCC.org, "Compressed Formats," 17 pp. [Downloaded from the World Wide Web on Feb. 9, 2004].

FOURCC.org, "YUV Formats," 15 pp. [Downloaded from the World Wide Web on Feb. 9, 2004].

FOURCC.org, "RGB Formats," 6 pp. [Downloaded from the World Wide Web on Feb. 9, 2004].

Jack, *Video Demystified: A Handbook for the Digital Engineer*, LLH Technology Publishing, pp. 15-34 (3d ed. 2001).

Microsoft Corporation, "4:2:0 Video Pixel Formats," 1 p. [Downloaded from the World Wide Web on Feb. 9, 2004].

Microsoft Corporation, "4:2:2 Video Pixel Formats," 1 p. [Downloaded from the World Wide Web on Feb. 9, 2004].

Microsoft Corporation, "FOURCC for Video Compression," 6 pp. [Downloaded from the World Wide Web on Feb. 9, 2004].

Microsoft Corporation, "YUV Video Subtypes," 2 pp. [Downloaded from the World Wide Web on Feb. 16, 2004].

Microsoft Corporation, "FOURCC Codes," 1 p. [Downloaded from the World Wide Web on Feb. 16, 2004].

Microsoft Corporation, "Registered FOURCC Codes and Wave Formats," 20 pp. (Sep. 2003) [Downloaded from the World Wide Web on Mar. 5, 2004].

Pirazzi et al., "Uncompressed Y'CbCr Video in QuickTime Files: Version Dec. 14, 1999," 37 pp., [Downloaded from the World Wide Web on Feb. 9, 2004].

Sullivan et al., "Video Rendering With 8-Bit YUV Formats," 12 pp. [Downloaded from the World Wide Web on Feb. 9, 2004].

SMPTE, "SMPTE 274-1998: SMPTE Standard for Television—1920×1080 Scanning and Analog and Parallel Digital Interfaces for Multiple Picture Rates," 24 pp. (1998).

(56) References Cited

OTHER PUBLICATIONS

PNG format [was: background image not displayed], Author: Claus Cyrny, Date: Dec. 7, 2001, pp. 3.
SGI DMediaPro DM3: High-Definition and Standard-Definition Video I/O Option, Author: SGI, pp. 2, Date: Jul. 18, 2003.
Cornell University, "RGBE Image Format Specifications," 1 p. (document dated Apr. 29, 1998) [Downloaded from the World Wide Web on Apr. 20, 2006].
Industrial Light & Magic, "Technical Introduction to OpenEXR," 13 pp. (Feb. 2005).
Krapf et al., "HDRI: High Dynamic Range Image," Dosch Design, 18 pp. (2005).
Malvar, "Fast Progressive Image Coding Without Wavelets," *IEEE Data Compression Conf.*, 10 pp., Snowbird, Utah (Mar. 2000).
Mantiuk et al., "Perception-Motivated High Dynamic Range Video Encoding", *ACM Transactions on Graphics*, vol. 23, Issue 3, pp. 733-741 (Aug. 2004).
Microsoft Corp., "Windows Media™ Photo Photographic Still Image File Format: Preliminary Specification, Version 0.9," 30 pp. (document dated Mar. 29, 2006) [Downloaded from the World Wide Web on Apr. 20, 2006].
Pittsburgh Supercomputing Center, "The IEEE Standard for Floating Point Arithmetic," 3 pp. [Downloaded from the World Wide Web on May 5, 2006].
"The RADIANCE Picture File Format," 21 pp. (document dated 1991-1994) [Downloaded from the World Wide Web on May 3, 2006].
Ward et al., "Subband Encoding of High Dynamic Range Imagery", *Proceedings of the 1st Symposium on Applied Perception in Graphics and Visualization*, pp. 83-90, Los Angeles, CA (2004).
Ward, "High Dynamic Range Image Encodings," Anyhere Software, 28 pp. (undated document) [Downloaded from the World Wide Web on May 5, 2006].
Ward Larson, "Overcoming Gamut and Dynamic Range Limitations in Digital Images", *Proceedings of the Sixth Color Imaging Conference*, 6 pp. (Nov. 1998).
Xu et al., "High-Dynamic Range Still-Image Encoding in JPEG 2000", *IEEE Computer Graphics and Applications*, pp. 57-64 (Nov./Dec. 2005).
U.S. Appl. No. 60/341,674, filed Dec. 17, 2001, Lee et al.
U.S. Appl. No. 60/488,710, filed Jul. 18, 2003, Srinivasan et al.
U.S. Appl. No. 60/501,081, filed Sep. 7, 2003, Srinivasan et al.
Aaron, "Wyner-Ziv Coding of Motion Video," Information Systems Laboratory Stanford University, 11 pp. (last modified Nov. 7, 2002).
Brainard et al., "Composite Television Coding: Subsampling and Interpolation," SMPTE Journal, pp. 717-724 (Aug. 1982).
Catmull et al., "A Class of Local Interpolating Splines," Computer Aided Geometric Design, Academic Press, pp. 317-326 (1974).
"DivX Multi Standard Video Encoder," 2 pp.
Dufaux et al., "Abstract: Motion-compensated generic coding of video based on a multi resolution data structure," 2 pp. (1993) [downloaded from the World Wide Web on Jan. 25, 2006].
Einarsson et al., "Mixed Resolution Video Coding for Low Bit-Rate Channels," Proc. Int'l Workshop on Coding Techniques for Very Low Bit-Rate Video: VLBV97, Linköping, Sweden, pp. 77-80 (Jul. 1997).
ISO/IEC, "ISO/IEC 11172-2, Information Technology—Coding of Moving Pictures and Associated Audio for Digital Storage Media at up to About 1.5 Mbit/s—Part 2: Video," 122 pp. (1993).
ISO/IEC, "JTC1/SC29/WG11 N2202, Information Technology—Coding of Audio-Visual Objects: Visual, ISO/IEC 14496-2," 329 pp. (1998).
ITU-T, "ITU-T Recommendation H.261, Video Codec for Audiovisual Services at px64 kbits," 25 pp. (1993).
ITU-T, "ITU-T Recommendation H.262, Information Technology—Generic Coding of Moving Pictures and Associated Audio Information: Video," 205 pp. (1995).
ITU-T, "ITU-T Recommendation H.263, Video coding for low bit rate communication," 162 pp. (1998).
ITU, "ITU-T Recommendation H.264: Advanced Video Coding for generic audiovisual services (May 2003)," 281 pp. (2004).
Iwahashi et al., "A Motion Compensation Technique for Downscaled Pictures in Layered Coding," IEICE Transactions on Comm., vol. E77-B , No. 8, pp. 1007-1012 (Aug. 1994).
Joint Video Team (JVT) of ISO/IEC MPEG and ITU-T VCEG, "Draft of Joint Scalable Video Model JSVM-4 Annex G," JVT-Q201, Nice, France, 166 pp. (Oct. 2005).
Joint Video Team (JVT) of ISO/IEC MPEG and ITU-T VCEG,, "Joint Committee Draft (CD)," JVT-C167, 3rd Meeting: Fairfax, Virginia, USA, 142 pp. (May 2002).
Joint Video Team (JVT) of ISO/IEC MPEG & ITU-T VCEG,, "Joint Final Committee Draft (JFCD) of Joint Video Specification," JVT-D157, 207 pp. (Aug. 2002).
Joint Video Team (JVT) of ISO/IEC MPEG and ITU-T VCEG,, "Joint Draft 7 of SVC Amendment (revision 2)," JVT-T201r2, Annex G, Klagenfurt, Austria; pp. i-xvii, 353-540 (Oct. 2005).
Keys, "Cubic Convolution Interpolation for Digital Image Processing," *Computer Graphics*, vol. ASSP-29, No. 6, pp. 1153-1160 (Dec. 1981).
Kwon et al., "Adaptive Bitrate Allocation in Spatial Scalable Video Coding of Fixed Total Bitrate," *IEICE Trans. Fundamentals*, vol. E81-A, No. 5, pp. 950-956 (May 1998).
Microsoft Corporation, "Microsoft Debuts New Windows Media Player 9 Series, Redefining Digital Media on the PC," 4 pp. (Sep. 4, 2002) [Downloaded from the World Wide Web on May 14, 2004].
Mitchell et al., "Reconstruction Filters in Computer Graphics," *Computer Graphics*, vol. 22, No. 4 pp. 221-228 (Aug. 1988).
Mook, "Next-Gen Windows Media Player Leaks to the Web," *BetaNews*, 17 pp. (Jul. 2002) [Downloaded from the World Wide Web on Aug. 8, 2003].
Printouts of FTP directories from http://ftp3.itu.ch, 8 pp. (downloaded from the World Wide Web on Sep. 20, 2005).
"Re: GL_RGBA8 vs. GL_RGB5_A1 vs. GL_RGBA," Author: Dario Accornero; Jul. 25, 2003, p. 1; http//lists.apple.com/archives/Mac-opengl/2003/Jul/msg00154.html.
Reader, "History of MPEG Video Compression—Ver. 4.0," 99 pp. (document marked Dec. 16, 2003).
Segall, "Study of Upsampling/Downsampling for Spatial Scalability," JVT-Q083, Nice, France, 18 pp. (Oct. 2005).
Sullivan, "Color Format Upconversion for Video Display," JVT-I019, San Diego, 6 pp. (Sep. 2003).
Sullivan et al., "The H.264/AVC Advanced Video Coding Standard: Overview and Introduction to the Fidelity Range Extensions," 21 pp. (Aug. 2004).
Sullivan, "Position Calculation for SVC Upsampling," JVT-R067, Bangkok, Thailand, 7 pp. (Jan. 2006).
Sullivan et al., "Position Calculation for SVC Upsampling," JVT-S067, Geneva, Switzerland, 12 pp. (Mar. 2006).
Sullivan, "Position Calculation for SVC Upsampling," JVT-U067, Hangzhou, China, 7 pp. (Oct. 2006).
Sun et al., "Unified Solution for Spatial Scalability," JVT-R018, Bangkok, Thailand, 6 pp. (Jan. 2006).
Wien, "Variable Block-Size Transforms for Hybrid Video Coding," Dissertation, 182 pp. (Feb. 2004).
International Search Report and Written Opinion for PCT/US2008/054481, Aug. 5, 2008, 10 pages.
Joint Video Team (JVT) of ISO/IEC MPEG & ITU-T VCEG, "Adaptive quantization encoding technique using an equal expected-value rule," JVT-N011, 9 pp. (Jan. 2005).
Joint Video Team (JVT) of ISO/IEC MPEG & ITU-T VCEG, "YCoCg-R: A Color Space with RGB Reversibility and Low Dynamic Range," JVT-I014r2, 8 pp. (Jul. 2003).
Coudoux et al., "Reduction of Color Bleeding, in DCT Block-Coded Video," in *Digital Video Image Quality and Perceptual Coding*, Ch. 16, pp. 489-502 (2006).
Kim et al., "Color Format Extension," JVT-H018, 17 pp. (May 2003).
Srinivasan et al., "HD Photo: A new image coding technology for digital photography," *SPIE Proc.*, 19 pp. (Sep. 2007).

\* cited by examiner

Software 180 implementing described techniques and tools for converting between different digital media data formats

HIGH DYNAMIC RANGE DATA FORMAT CONVERSIONS FOR DIGITAL MEDIA

FIELD

This invention relates to conversions of high dynamic range data formats for digital media.

BACKGROUND

With the introduction of compact disks, digital video disks, portable digital media players, digital cameras, digital wireless networks, and digital media delivery over the Internet, digital media (still images, video and audio) has become commonplace. Engineers use a variety of techniques to process digital media efficiently while still maintaining quality of the digital media.

In video and imaging systems, color generally is represented as vector coordinates in a multi-dimensional "color space" having three or more color channels. Common examples include the well-known classes of RGB and YUV color spaces. The RGB color spaces specify pixel values using coordinates that represent intensities of red, green and blue light, respectively. The YUV color spaces specify pixel values using coordinates that represent a luminance or chrominance value.

Currently, many image capture, processing and display devices can only handle pixel values with a small dynamic range of 256 ($2^8$) discrete values per color channel, represented by 8 bits. Some devices can handle up to a 10- or 12-bit dynamic range per color channel. However, the human vision system can detect a wide luminance range of 14 orders of magnitude, which translates to around 46 bits. Luminance values in nature can be as high as $10^8$ candela/m$^2$ in bright sunlight, and as low as $10^{-6}$ candela/m$^2$ on the underside of a rock on a moonless night.

High dynamic range (HDR) imaging presents a more versatile and natural image representation in line with the human vision system. HDR images can present a dynamic range higher than the traditional 8-bit, 10-bit and 12-bit representations to achieve a far higher image quality. HDR images can be used in the same kinds of devices and software tools that process conventional images if the HDR image format is compatible with the device or tool. Several HDR image formats have been developed, and cameras, computer graphics and display devices have begun to produce process and display images with increasing dynamic ranges. The pixel value in an HDR image is commonly represented as floating point data or integer data.

When the number of bits used to represent a pixel in an HDR image exceeds the number of bits that a lower dynamic range codec can handle, adjustments must be made. For example, and encoder can simply truncate the pixel information to reduce the number of bits. However, simple truncation can lead to visible artifacts in the decoded picture.

Whatever the benefits of previous techniques, they do not have the advantages of the techniques and tools presented below.

SUMMARY

In summary, the detailed description is directed to aspects of encoding and decoding digital media data, and in particular, encoding and decoding high dynamic range digital media data in digital media encoders and decoders.

In one aspect, a digital media encoder receives digital media data (e.g., still image data) in a first format (e.g., RGBE) comprising a mantissa for each of three color channels and a common exponent. For each color channel, the encoder forms a mantissa-exponent pair comprising the mantissa of the color channel and the common exponent. For each mantissa-exponent pair, if the most significant bit of the mantissa is 0 or the exponent of the pair is greater than 1, the encoder left-shifts the mantissa of the pair and decrements the exponent of the pair. The encoder outputs compressed digital media data in a second format (e.g., integer RGB) with a different dynamic range than the first format. A digital media decoder can decompress the compressed digital media data.

In another aspect, a digital media encoder receives digital media data in a floating point format comprising a sign bit, an exponent and a mantissa having a first bit length. The encoder obtains a scaled exponent by scaling the exponent with an exponent bias value. The encoder outputs compressed digital media data in an integer format with a different dynamic range than the floating point format. The compressed digital media data in the integer format comprises the scaled exponent and the mantissa. The mantissa can be cast to a second bit length (which can be specified by a user) that differs from the first bit length. The second bit length of the mantissa can be adjusted for rate control or to improve rate-distortion performance. Based on the sign bit, the encoder may perform a 2's complement operation prior to outputting compressed digital media data.

In another aspect, a digital media encoder receives digital media data in an n-bit integer format and selects between a linear conversion and a nonlinear conversion. If the linear conversion is selected, the encoder right-shifts the digital media data in the n-bit integer format by a number of bits to convert the digital media data to a k-bit integer format, where k is less than n. If the nonlinear conversion is selected, the encoder selects a mantissa length and an exponent bias for a k-bit floating point format and converts the digital media data to the k-bit floating point format. The encoder can signal the linear/nonlinear conversion decision (and/or other encoder decisions or conversion parameters) in an encoded bitstream.

In another aspect, a continuous mapping is defined at a digital media encoder to convert input digital media data in a first high dynamic range format to a second format with a smaller dynamic range than the first format. The encoder converts the input digital media data to the second format with the smaller dynamic range using the continuous mapping and one or more conversion parameters relating to the continuous mapping. The encoder encodes the converted digital media data in a bitstream along with the conversion parameter(s). The conversion parameter(s) enable a digital media decoder to convert the converted digital media data back to the first high dynamic range format from the second format with the smaller dynamic range.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The foregoing and other objects, features, and advantages will become more apparent from the following detailed description, which proceeds with reference to the accompanying figures.

DETAILED DESCRIPTION

The present application relates to techniques and tools for efficient compression and decompression of digital media data. In various described embodiments, a still image encoder and/or decoder incorporate techniques for compressing and/or decompressing high dynamic range (HDR) image data.

Various alternatives to the implementations described herein are possible. For example, techniques described with reference to flowchart diagrams can be altered by changing the ordering of stages shown in the flowcharts, by repeating or omitting certain stages, etc. As another example, although some implementations are described with reference to specific digital media formats, other formats also can be used.

The various techniques and tools can be used in combination or independently. Different embodiments implement one or more of the described techniques and tools. Some techniques and tools described herein can be used in a still image encoder or decoder, or in some other system not specifically limited to still image encoding or decoding.

I. Computing Environment

Figure 1:
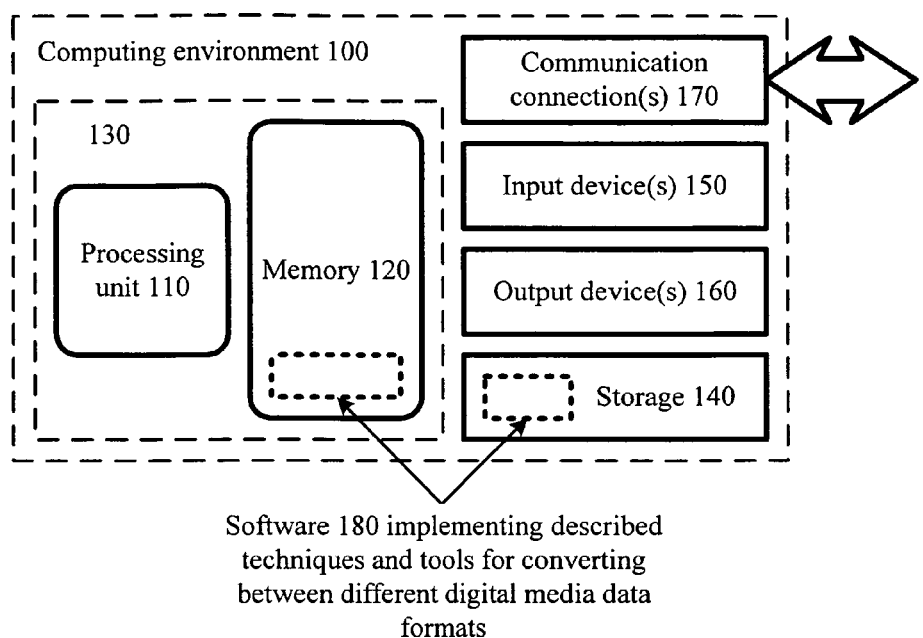
FIG. 1 is a block diagram of a suitable computing environment for implementing techniques and tools for converting between digital media data formats.

FIG. 1 illustrates a generalized example of a suitable computing environment 100 in which several of the described embodiments may be implemented. The computing environment 100 is not intended to suggest any limitation as to scope of use or functionality, as the techniques and tools may be implemented in diverse general-purpose or special-purpose computing environments.

With reference to FIG. 1, the computing environment 100 includes at least one processing unit 110 and memory 120. In FIG. 1, this most basic configuration 130 is included within a dashed line. The processing unit 110 executes computer-executable instructions and may be a real or a virtual processor. In a multi-processing system, multiple processing units execute computer-executable instructions to increase processing power. The memory 120 may be volatile memory (e.g., registers, cache, RAM), non-volatile memory (e.g., ROM, EEPROM, flash memory, etc.), or some combination of the two. The memory 120 stores software 180 implementing a digital media encoder or decoder with one or more of the described techniques and tools.

A computing environment may have additional features. For example, the computing environment 100 includes storage 140, one or more input devices 150, one or more output devices 160, and one or more communication connections 170. An interconnection mechanism (not shown) such as a bus, controller, or network interconnects the components of the computing environment 100. Typically, operating system software (not shown) provides an operating environment for other software executing in the computing environment 100, and coordinates activities of the components of the computing environment 100.

The storage 140 may be removable or non-removable, and includes magnetic disks, magnetic tapes or cassettes, CD-ROMs, DVDs (including high-definition DVDs), or any other medium which can be used to store information and which can be accessed within the computing environment 100. The storage 140 stores instructions for the software 180 implementing the digital media encoder or decoder.

The input device(s) 150 may be a touch input device such as a keyboard, mouse, pen, or trackball, a voice input device, a scanning device, still image capture device (e.g., digital camera), or another device that provides input to the computing environment 100. For audio or video encoding, the input device(s) 150 may be a sound card, video card, TV tuner card, or similar device that accepts audio or video input in analog or digital form, or a CD-ROM or CD-RW that reads audio or video samples into the computing environment 100. The output device(s) 160 may be a display, printer, speaker, CD- or DVD-writer, or another device that provides output from the computing environment 100.

The communication connection(s) 170 enable communication over a communication medium to another computing entity. The communication medium conveys information such as computer-executable instructions, digital media input or output, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The techniques and tools can be described in the general context of computer-readable media. Computer-readable media are any available media that can be accessed within a computing environment. By way of example, and not limitation, with the computing environment 100, computer-readable media include memory 120, storage 140, communication media, and combinations of any of the above.

The techniques and tools can be described in the general context of computer-executable instructions, such as those included in program modules, being executed in a computing environment on a target real or virtual processor. Generally, program modules include routines, programs, libraries, objects, classes, components, data structures, etc., that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "select" and "receive" to describe computer operations in a computing environment. These terms are high-level abstractions for operations performed by a computer, and should not be confused with acts performed by a human being. The actual computer operations corresponding to these terms vary depending on implementation.

II. Techniques for High Dynamic Range Image Data Compression

Several still image compression standards have been developed, such as JPEG and JPEG2000. These standards set forth requirements for decoders to decode images encoded in a JPEG or JPEG2000 format. A JPEG2000-compliant encoder and decoder ("codec") provides high-quality images with good compression efficiency. Windows Media™ Photo ("WMP") is a state-of-the-art still image codec which can achieve compression efficiency comparable to JPEG2000. A basic WMP codec can handle a dynamic range not higher than 24 bits per color channel.

Because the WMP codec and other codecs have dynamic range constraints, there is a need for techniques and tools for processing HDR images within dynamic range constraints. Accordingly, techniques and tools are described for converting pixel formats commonly used to carry HDR image information to other formats. Conversion techniques are used where, for example, the bit depth of an HDR pixel value exceeds the permissible range of a still image codec. For example, the WMP codec can support an internal dynamic range of 24 bits per channel (e.g., in a 24-bit signed integer format, or a 24-bit floating point format).

Rounding or truncation operations on HDR pixels disallow the possibility of lossless encoding and may cause visible artifacts (e.g., due to underflows and overflows caused by rounding). In the examples described below, several pixel formats (e.g., RGBE, 32-bit float, 16-bit "half" float) commonly used to carry HDR image information are described, and techniques are described to handle these pixel formats for effective encoding and decoding in codecs with dynamic range constraints.

Described techniques for converting between pixel formats allow both lossless and lossy coding when the data ranges allow for this to happen. Data loss in described techniques is a probabilistically bounded loss (e.g., for a given quantization parameter). Described techniques reduce the likelihood of major artifacts such as rollover (e.g., where a value of a dark pixel "rolls over" to a bright pixel due to underflow or overflow).

Described techniques can represent data in a compressed file independent of the source pixel format. For example, an encoder/decoder can encode an RGBE file into a compressed file and decode the compressed file to a meaningful 32-bit float file. Subject to format and data range constraints, reverse conversions also are possible. An encoder/decoder can transcode from an HDR to a non-HDR format (such as an 8-bit format) to produce a meaningful (although degraded) representation of the original HDR image. In described techniques, mappings of data from an HDR space to a representation with a different dynamic range are continuous and smooth.

A. Example HDR Formats

The following are examples of HDR formats that can be converted by one or more of the described techniques and tools.

1. Radiance RGBE

Figure 2:
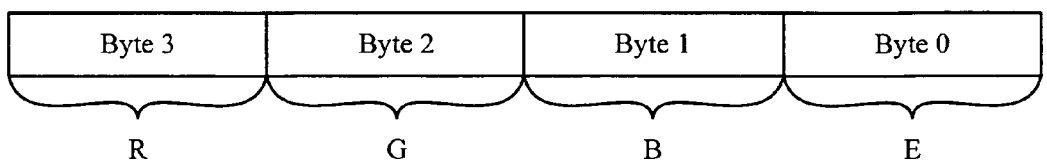
FIG. 2 is a block diagram showing an RGBE pixel data format.

Radiance RGBE is a widely used format for carrying HDR image data. In an RGBE image, each pixel is represented by 32 bits: one group of bits (e.g., one byte) for a red mantissa (R), one group of bits (e.g., one byte) for a green mantissa (G), one group of bits (e.g., one byte) for a blue mantissa (B), and the remaining bits (e.g., one byte) for a common exponent (E), as shown in FIG. 2. Data formats that use a common exponent for color channel mantissas can be referred to as common exponent formats.

In RGBE, effective pixel values (fR, fG, fB) are floating point numbers defined as:

$$fR = R*2^{(E-128)};$$
$$fG = G*2^{(E-128)};$$
$$fB = B*2^{(E-128)} \qquad (1)$$

Reverse conversion from RGB to RGBE is a little bit more complex. An RGBE rule restricts the largest 8-bit mantissa within the range [128 255], while the other two 8-bit mantissas are unrestricted (i.e., the range is [0 255]). So, the mapping from RGB to RGBE is unique. The dynamic range that RGBE can present is $[2^{-127}\ 2^{+127}]$, which is approximately 76 orders of magnitude. The RGB value reconstructed from an RGBE pixel is unsigned—all nonzero values are positive. However, since the three color components share the same exponent, the precision of the two smaller components is sacrificed. E=0 is a special case, indicating that the corresponding pixel value is zero.

One variant of Radiance RGBE (9:9:9:5) assigns 9 bits each to the red, green and blue mantissa channels, and 5 bits to the exponent, thus representing each pixel in 32 bits as in the 8:8:8:8 format described above. Other representations of RGBE also are possible, with different numbers of bits assigned to the mantissas and the exponent.

2. 32-bit Float 32-bit floating point ("32-bit float") is commonly used in representing floating point image data. Container formats defining 32-bit floating point images include Portable Float Map ("PFM") and Tagged Image File Format ("TIFF"). The IEEE 754 32-bit single-precision float number includes 1 bit for the sign (s), 8 bits for the exponent (e) and 23 bits for the mantissa (m). The float value is calculated as shown in equation (2):

$$\begin{aligned} f &= (-1)^s * 2^{e-c} * (1.m) & \text{if } 0 < e < 255; \\ f &= (-1)^s * 2^{-(c-1)} * (0.m) & \text{if } e = 0 \text{ and } m \mathrel{!}= 0; \\ f &= 0.0 & \text{if } e = 0 \text{ and } m = 0; \\ f &= INF \text{ (infinity)} & \text{if } e = 255 \text{ and } m = 0; \\ f &= NaN & \text{if } e = 255 \text{ and } m \mathrel{!}= 0, \end{aligned} \qquad (2)$$

where c is the shift value (bias) for the exponent (c=127 for 32-bit float), and NaN is a special symbol meaning that the data is "not a number," which is used to indicate erroneous results. An encoder can choose different values of c, as appropriate.

3. 16-bit Float ("Half")

16-bit floats (also referred to as "half") have one sign bit, five exponent bits and ten mantissa bits. Since the 16-bit and 32-bit floating point representations are structurally identical except for specific differences in lengths of fields, they can be referred to generically as "floating point."

4. 32-bit Signed and Unsigned Integers 32-bit integers are also used to carry image data. However, in a codec that can handle a data range of fewer than 32 bits per channel (e.g., 24 bits per channel), techniques are needed for reducing the range of 32-bit integers to the smaller number of bits for compression, and for expanding back to the full range for decompression.

Thus, techniques are described for adapting digital media formats such as RGBE, 32-bit floating point and 32-bit integers to acceptable formats for codecs with different dynamic ranges.

B. Encoding and Decoding Different Dynamic Range Formats in Dynamic Range-Constrained Codecs This section describes techniques for adapting RGBE, 32-bit floats, 16-bit floats, 32-bit integers, and other formats for use with dynamic range-constrained digital media codecs. For example, one or more of the following techniques can be implemented.

- A technique for converting data in an RGBE format to an integerized RGB format, and vice versa.
- A technique for encoding and decoding HDR floating point data (e.g., 32-bit floats) by using, for example, sign bit extension, and selection of mantissa length and exponent bias for floating point data.
- A technique for encoding and decoding 32-bit unsigned and signed integers using, for example, pre/post bit-shifting and signaling the pre/post shift bits.

Other techniques also are described.

In the examples described herein, specific techniques are described as being performed by encoders (which typically perform compression) and decoders (which typically perform decompression). However, it should be understood that techniques described in terms of an "encoder" can be performed in an intermediate forward conversion or compression operation within a decompression or other conversion stage, and that techniques described in terms of a "decoder" can be performed in an intermediate inverse conversion or decompression operation within a compression or other conversion stage.

1. Sign Extension

With sign extension, data having a bit depth n can be remapped to a bit depth m, where m>n, by extending the sign bit of the n-bit data. For example, data of a bit depth less than or equal to 24 bits can be remapped to 24 or 32 bits internal representation (or potentially other internal representations). This allows the same functional blocks to be used for compressing 8-bit images, 10-bit images and 12-bit images, and other images. Further, the actual range of data in the internal representation need not take up the full dynamic range of the encoder and decoder, as long as the data does not exceed the maximum number of significant bits for the encoder and decoder.

An example image codec compresses images represented with integer-valued pixels. The permissible range of input is 24 bits, signed. 2's complement representation is used for negative numbers.

For pixel data encoded or decoded by a 24-bit dynamic range codec that is represented in 32-bit signed integers, for each data point X, the most significant 9 bits are all zero or all one. This is because the '2's complement' representation of negative X as a 32-bit signed integer sets the first 9 bits to one. If X is positive, these first 9 bits are all zero. Therefore, a data point X represented as a 32-bit signed integer will only have 24 bits of actual data when encoded or decoded by a 24-bit dynamic range codec.

Figure 3:
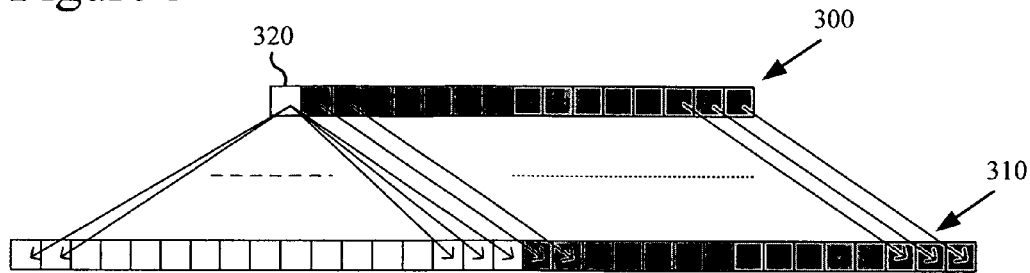
FIG. 3 is a block diagram showing an example sign extension technique.

An integer with a smaller number of bits, such as a 16-bit signed integer, can be put into a longer signed integer format, such as a 32-bit signed integer, using sign extension. For example, an encoder can copy the 16 bits of a 16-bit integer S into the least significant bits of a 32-bit integer X, and then copy the most significant bit of S into the top 16 bits of X. In the example shown in FIG. 3, sign extension is performed from a 16-bit word 300 to a 32-bit word 310. The least significant bits ("LSBs") are on the right. The sign bit 320 of 16-bit word 300 is copied into the top 17 bits of the 32-bit word 310.

The reverse process of sign extension may involve a clamping operation in case of overflows and underflows. For instance, a signed 8 bit image under lossy compression may decompress to pixel values less than −128 or greater than 127 (e.g., values greater than 127 are clamped to 127, and values less than −128 are clamped to −128).

2. Encoding and Decoding of Common Exponent Data

The term "common exponent data" can be used to refer to data in a format with plural color channel mantissas and common exponent. For example, as noted above, in an RGBE image, each pixel is represented by 32 bits: one group of bits (e.g., one byte) for a red mantissa (R), one group of bits (e.g., one byte) for a green mantissa (G), one group of bits (e.g., one byte) for a blue mantissa (B), and the remaining bits (e.g., one byte) for a common exponent (E), as shown in FIG. 2. Some example techniques for converting common exponent data are described below.

Forward Conversion

In a forward conversion from RGBE to a 16-bit RGB format, an encoder could combine the exponent E and each mantissa (R, G, B) for a 16-bit representation. In this naïve mapping, the 8 bits of E occupy the top 8 bits of the 16 bit representation for each channel, and the lower 8 bits are occupied by red, green and blue mantissas, respectively. Unfortunately, this representation will give rise to visible artifacts in lossy compression since the mapping between RGB and RGBE is discontinuous. Another way to code RGBE is to treat the exponent E as a separate plane. However, treating the exponent E as a separate plane effectively changes the three-channel RGBE format to a four-channel format (with E as the fourth channel) with encoding/decoding requirements that are inconsistent with a three-channel RGB format. Treating the exponent E as a separate plane would make the compressed format dependent on the source format and would not allow direct decompression to floating point formats without first forming the RGBE representation and then converting to floating point. It is desirable for the coded image to represent a collection of pixels with no dependency on the format of the source pixels.

Accordingly, techniques are described for converting common exponent data to integerized data such that the mappings are continuous. For example, a technique is described in which an encoder codes RGBE by converting RGBE data to three-channel, 16-bit integerized data that can be handled by an encoder with a larger dynamic range (e.g., 24 bits per channel) using sign extension.

Figure 4:
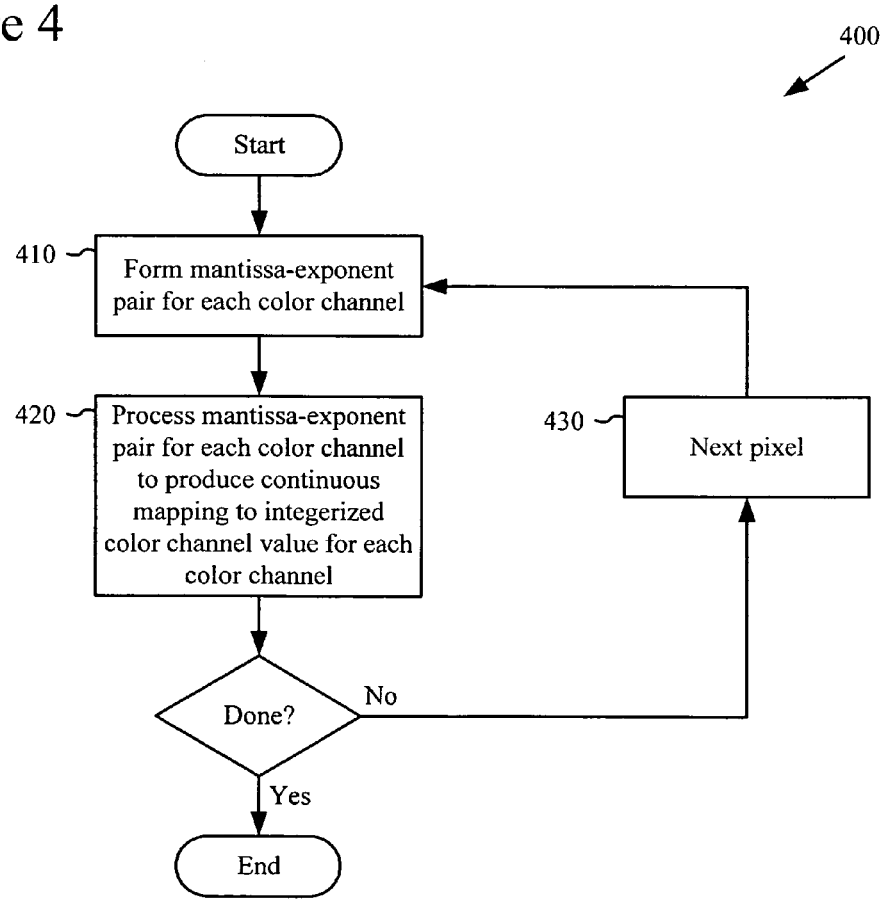
FIG. 4 is a flow chart showing a generalized technique for converting common exponent data to integerized color channel data.

FIG. 4 shows a generalized technique 400 for converting common exponent data to integerized color channel data. At 410, using the mantissas and the common exponent from the common exponent data, an encoder forms a mantissa-exponent pair for each color channel. At 420, the encoder performs additional processing on the mantissa-exponent pair for each color channel to produce an integerized color channel value for each color channel. The additional processing ensures a continuous mapping between the common exponent data and the integerized data. If there are more pixels to be processed, the encoder processes the next pixel at 430.

Figure 5:
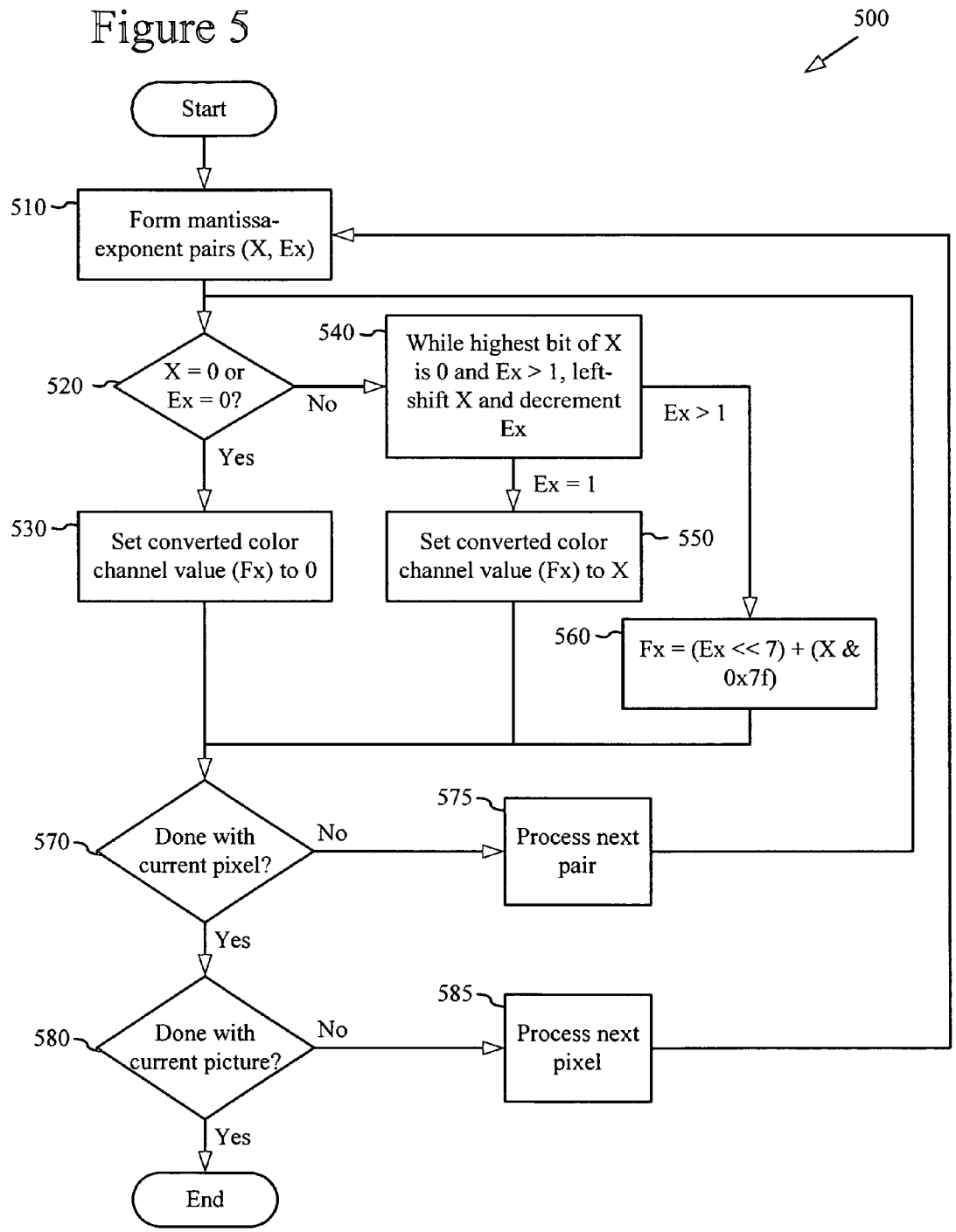
FIG. 5 is a flow chart showing a detailed technique for converting RGBE data to RGB data.

FIG. 5 shows a detailed technique 500 for converting RGBE data to RGB data. At 510, an encoder forms three pairs of mantissa and exponent values ((R, Er); (G, Eg); (B, Eb)). Let X represent the mantissa of a current mantissa-exponent pair, let Ex represent the exponent of the current mantissa-exponent pair, and let Fx represent a forward-converted color channel value based on the current mantissa-exponent pair. In this example, the initial values of Er, Eg and Eb are set to the common exponent E.

At 520, if X=0 or Ex=0, the corresponding color channel value is 0. In this case, the encoder sets the forward-converted value Fx to 0 at 530. If the special case shown at 520 does not apply, the encoder proceeds as follows. At 540, while the highest bit of the mantissa X is 0 and the exponent Ex is greater than 1, the encoder left-shifts the mantissa X and decrements the exponent Ex. This step preserves the effective pixel value which is of the form $c \cdot X \cdot 2^{Ex}$, for an arbitrary constant c. An optional bias may be applied after the left shift. The encoder terminates this "while" loop only when the highest bit of the mantissa is 1 and the exponent Ex is less than or equal to 1.

If the terminal value of Ex is 1 (i.e., if the encoder exits the while loop 540 when Ex=1), the encoder sets the converted value Fx to X at 550. This is referred to as the denormal conversion. If the terminal value of Ex is >1, the encoder sets the converted value Fx to (Ex<<7)+(X & 0x7f) at 560. In other words, the encoder sets the seven LSBs of the converted value to the seven LSBs of X, and sets the top bits, or most significant bits ("MSBs"), of the converted value to Ex. This is referred to as the normal conversion. This is a reversible operation, since the MSB of X is always 1, due to the fact that it has been left-shifted until the MSB is no longer 0. The encoder treats the result (Fr, Fg, Fb) as a triad of integers.

If there are more mantissa-exponent pairs to be processed in the current pixel (570), the encoder processes the next pair at 575. If there are no more pairs to be processed in the current pixel, and if there are more pixels to be processed in the current picture (580), the encoder processes the next pixel at 585.

The technique 500 can be modified for use with other input formats. For example, modified versions of the technique 500 can be used with alternative definitions of RGBE, such as 9:9:9:5 (exponent size is 5 bits). For the RGBE 9:9:9:5 case, the only modification to the above technique is to set the Fx to (Ex<<8)+(X & 0xff) when the while loop is terminated and Ex is >1.

Inverse Conversion

Figure 6:
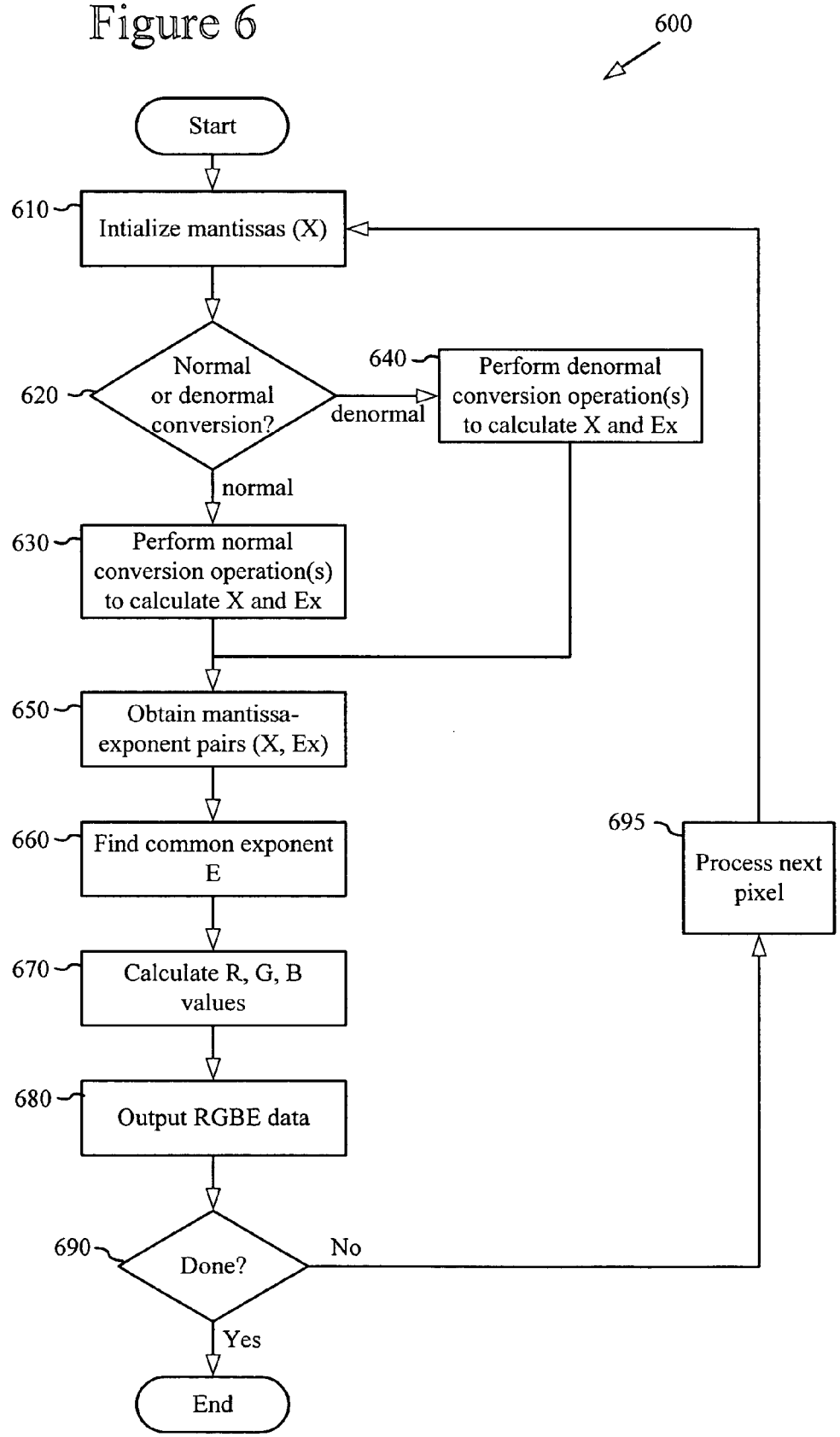
FIG. 6 is a flow chart showing a detailed technique for inverse conversion from RGB to RGBE.

FIG. 6 shows a detailed example technique 600 for inverse conversion from RGB to RGBE (e.g., at a decoder).

At 610, the decoder sets the mantissa X (R, G or B) to be equal to the corresponding converted RGB color channel value Fx (Fr, Fg or Fb). The decoder marks values of mantissa X (R, G or B) less than or equal to 0 as 0, setting X=0 and Ex=0. At 620, for each X, the decoder determines whether the "normal" or "denormal" conversion applies. The "normal" conversion applies when (X>>7) is greater than 1, otherwise the "denormal" conversion applies. At 630 and 640, the decoder performs "normal" or "denormal" conversion operations, depending on which conversion applies. If "normal" conversion applies, the decoder sets Ex=(X>>7) and sets X=(X & 0x7f)+0x80. When the "denormal" conversion applies (e.g., when (X>>7) is not greater than 1), the decoder sets Ex=1, and X is unchanged.

At 650, the decoder obtains three mantissa-exponent pairs (R, Er), (G, Eg) and (B, Eb). The three exponents generated initially may not be the same, so a common exponent is computed before forming the RGBE pixel. At 660, the decoder finds the common exponent E. For example, the decoder finds the maximum of Er, Eg and Eb (E=max(Er, Eg, Eb)). At 670, for each color component, the decoder uses the common exponent E and the mantissa-exponent pairs to calculate values of R, G and B for the RGBE format. For example, for each of the three color components X, the decoder sets X=(X+r)>>(E−Ex), where r is a rounding offset for the division or right shift. Then, at 680, the decoder outputs the result (RGBE) of the inverse conversion. If there are more pixels to be processed in the current picture (690), the encoder processes the next pixel at 695.

Specific described forward and inverse steps can produce bit-exact inverses of each other in the general case (i.e., when special cases such as E=0, or invalid RGBE values, do not apply).

As with forward conversion, the technique 600 can be modified to work with other formats, such as for alternative definitions of RGBE. For the RGBE 9:9:9:5 case, the modification to the above technique is described below.

For each X, the decoder determines whether the "normal" or "denormal" conversion applies. The "normal" conversion applies when (X>>8) is greater than 1. In this case, the decoder sets Ex=(X>>8) and sets X=(X & 0xff)+0x100. When the denormal conversion applies (e.g., when (X>>8) is not greater than 1), the decoder sets Ex=1, and X is unchanged.

3. Encoding and Decoding of Floating Point Data

In described floating point conversion techniques, an encoder encodes floating point data by considering the floating point number (typically represented in 16 or 32 bits) as though it were an integer. Typically, the sign of floating point data is carried in a sign bit located in the MSB position. The floating point numbers ϵ and −ϵ differ by one bit in the MSB position, regardless of the value of ϵ. However, even when ϵ is the smallest nonzero number that can be represented, the integer representations of ϵ and −ϵ differ significantly in integer arithmetic, which creates inefficiencies and unacceptable artifacts when signed data is compressed.

Often, the number of mantissa and exponent bits suitable for an application is different from the default mantissa and exponent bits in a particular representation of a floating point value. Compression efficiency may be improved by using smaller mantissa sizes where possible to reduce overall data range. Further, adjusting mantissa and/or exponent bits may be necessary for some codecs, such as when the data range is outside what a codec can natively handle.

One or more of the described techniques and tools can be used to overcome these issues. For example, an encoder can perform a 2's complement operation on floating point data based on the sign bit. For positive and negative numbers, interpreting a 16-bit or 32-bit floating point number as an integer produces a smooth or continuous mapping. The only discontinuity is at zero. By performing a 2's complement operation on the data, the discontinuity at zero is removed.

As another example, an encoder can represent floating point numbers ("floats") with an arbitrary number of mantissa bits. The number of exponent bits is constrained to be strictly smaller than the dynamic range of the codec, minus the number of mantissa bits. For instance, for a 24-bit dynamic range codec and 16 mantissa bits, the number of exponent bits can be no more than 7. The one extra bit is for the sign bit information.

Figure 7:
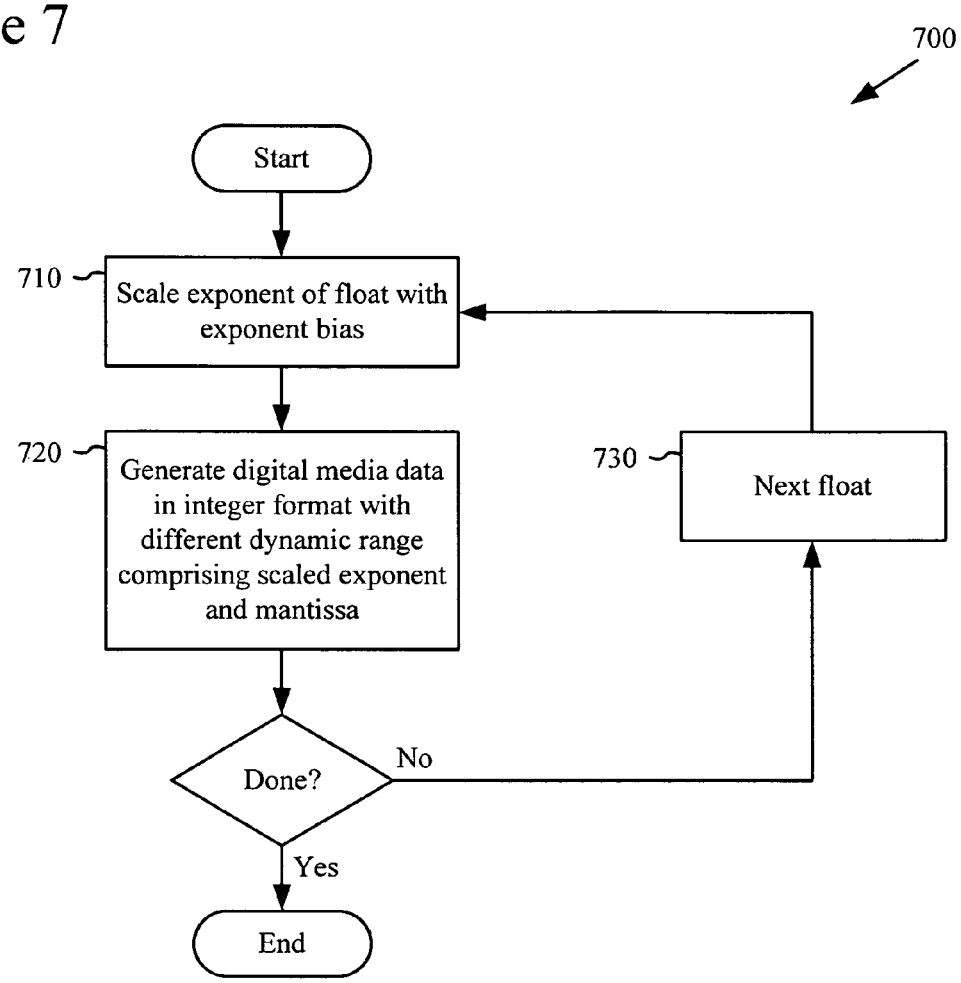
FIG. 7 is a flow chart showing a generalized technique for converting digital media data in a floating point format comprising a sign bit, an exponent and a mantissa to an integer format having a different dynamic range.

FIG. 7 shows a generalized technique 700 for converting digital media data in a floating point format comprising a sign bit, an exponent and a mantissa to an integer format having a different dynamic range. At 710, the encoder obtains a scaled exponent by scaling the exponent of the floating point data with an exponent bias value. At 720, the encoder generates digital media data in an integer format with a different dynamic range. The digital media data in the integer format comprises the scaled exponent and the mantissa. The mantissa in the integer format may be the same bit length, or shorter or longer than the mantissa of the floating point format. If there are more floats (e.g., representing color components in a pixel) to be processed, the encoder processes the next float at 730. The encoder can output the generated digital media data in the integer format (e.g., to a decoder).

An exponent bias parameter c determines the scaling factor of the resulting floating point value. The forward and inverse conversion processes (float-to-integer and integer-to-float, respectively) are described below (e.g., for 32-bit and 16-bit floats).

32-bit Floating Point Forward Conversion

For floating point conversions, an encoder can specify (either automatically or with user input) two parameters: the exponent bias, c, and the length of mantissa, $l_m$.

Figure 8:
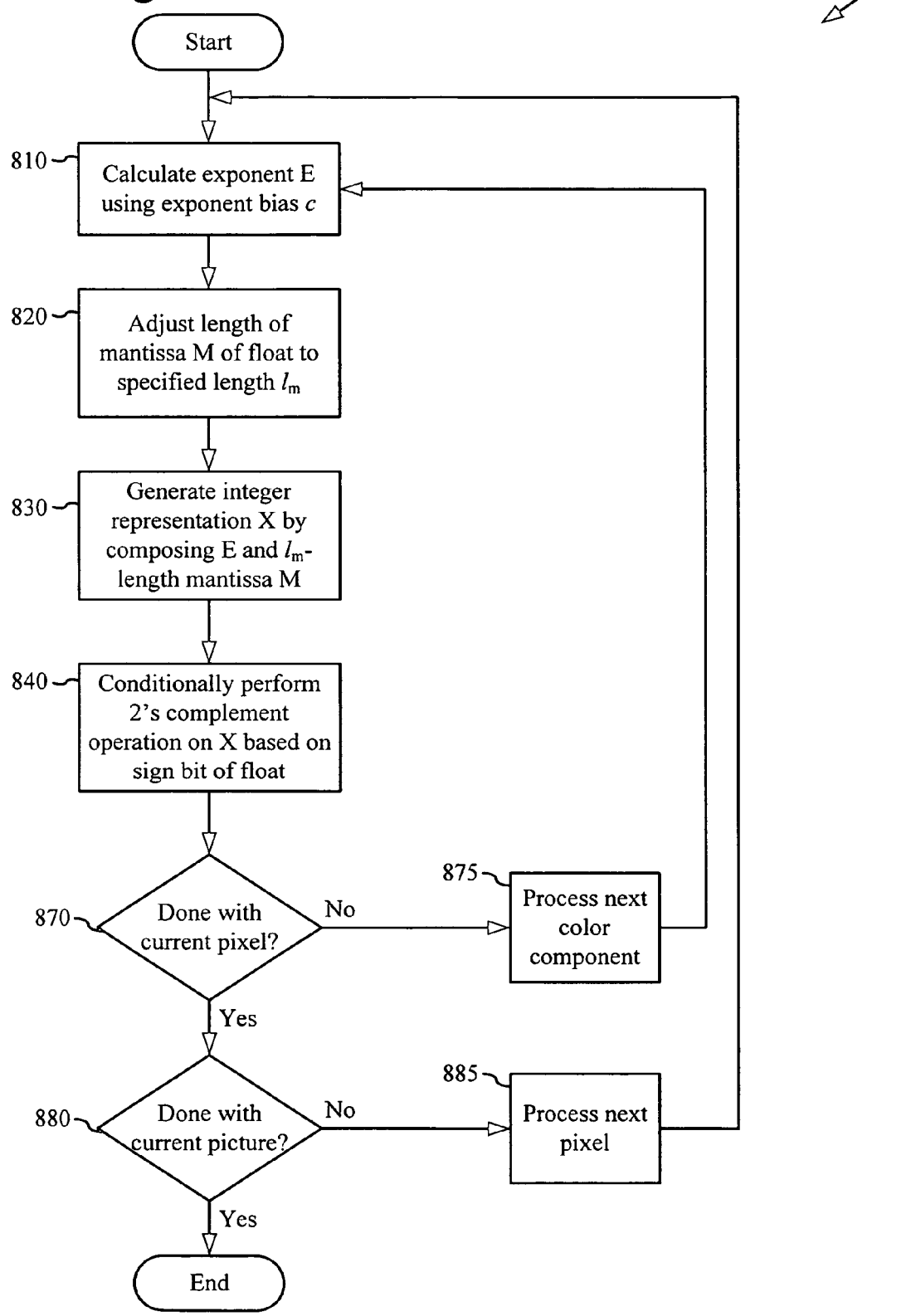
FIG. 8 is a flow chart showing a detailed technique for a forward conversion of digital media data from a 32-bit float format to an integer format.

FIG. 8 shows a detailed example technique 800 for a forward conversion of still image pixel data from 32-bit float to integer. At 810, an encoder calculates the exponent E using an exponent bias c, such that E≥0. If any exponent E is negative, the user specified c parameter is invalid. For the 32 bit IEEE floating point standard, the exponent $E_f$ is represented in 8 bits. In this case the exponent E is calculated from $E_f$ and c as $E=E_f-127+c$. At 820, the encoder adjusts the length of the mantissa of the 32-bit float representation by truncating or extending it, as appropriate, to the length of the user-specified mantissa $l_m$, if it differs from the 32-bit float mantissa length. Truncation of the mantissa happens if $l_m$ is smaller than the size of mantissa $L_m$ in bits (which for the 32 bit IEEE floating point standard is 23). In this example, truncation is carried out by discarding the $L_m-l_m$ least significant bits of the mantissa. If $L_m<l_m$, the mantissa bits are left shifted by $l_m-L_m$ bits. At 830, the encoder generates an integer representation X by composing the exponent E and the $l_m$ length mantissa M, such that $X=((E<<l_m)|M)$. M occupies the LSBs and E occupies the MSBs. In this example, the encoder pads any remaining MSBs with 0s.

At 840, the encoder conditionally performs a 2's complement on X based on the sign bit S of the original floating point number. If S is 1, the encoder sets $X=(X\hat{}(-1))+1$. If S is zero, X remains unchanged.

If there are more color components to be processed in the current pixel (870), the encoder processes the next color component at 875. If there are no more color component to be processed in the current pixel, and if there are more pixels to be processed in the current picture (880), the encoder processes the next pixel at 885.

By allowing control of the target exponent bias and length of mantissa (automatically or with user input), the encoder can control the input precision. With the increase of the length of mantissa, the bit rate increases and the quality is improved. Thus, a flexible mantissa length provides flexibility for the rate-distortion control. Extending the sign bit can improve presentation of negative numbers and coding efficiency.

32-bit Floating Point Inverse Conversion

Figure 9:
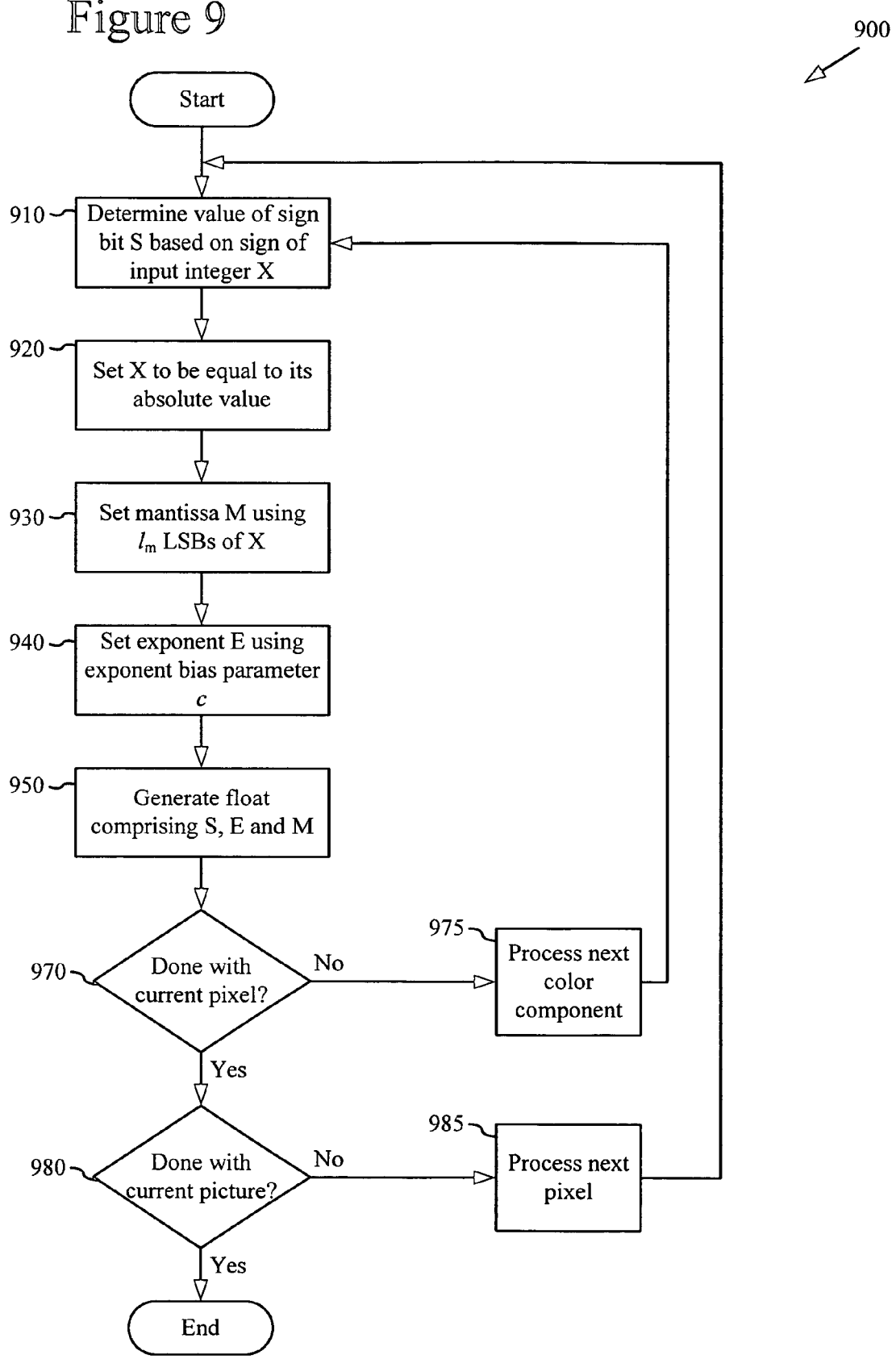
FIG. 9 is a flow chart showing a detailed technique for inverse conversion of digital media data in an integer format to a 32-bit float format.

FIG. 9 shows an example inverse conversion technique 900 (e.g., at a decoder) for converting still image pixel data in an integer format to 32-bit floats. In this example, a decoder finds the sign bit S, exponent E, and mantissa M for a 32-bit float using the bits of an integer X, a specified mantissa length $l_m$, and an exponent bias c. At 910, a decoder determines the value of the sign bit S from the input integer X for a color component (e.g., R, G or B) by examining whether X is negative. For example, S is 1 if X is negative. Otherwise, S is 0. At 920, the decoder sets X to its absolute value (X=abs(X)). At 930, the decoder sets the $l_m$ MSBs of the mantissa M to be equal to the $l_m$ bits in the LSBs of X. This may involve a truncation or left-shift, as necessary. At 940, the decoder sets the exponent E using the exponent bias c and a shift value appropriate for a 32-bit float (e.g., 127). For example, the decoder sets the exponent E according to the equation $E=(X>>l_m)-c+127$. At 950, the decoder performs a bit composition on the sign bit S, the mantissa M, and the exponent E to form a 32-bit float F, such that F=[S (1 bit)|E (8 bits)|M (23 bits)].

If there are more color components to be processed in the current pixel (970), the encoder processes the next color component at 975. If there are no more color component to be processed in the current pixel, and if there are more pixels to be processed in the current picture (980), the encoder processes the next pixel at 985.

The example forward and inverse conversions described above with reference to 32-bit floats can be adapted to encode 16-bit floats, 64-bit floats, and other representations of floating point data. The modifications include: (1) replacing the shift value (127 for 32-bit float) with an appropriate shift value for the exponent of a particular float; and (2) shifting sign, exponent and mantissa bits to an appropriate position according to the float's definition.

16-bit Float ("Half")

In described techniques, the treatment of floating point data (e.g., 32-bit floats) is very flexible. For example, described techniques include the use of two parameters (user-specified, or determined by the encoder) to help define a conversion process. The parameters can help an encoder process floating point data with a greater dynamic range than the encoder can normally handle for specific encoding operations, such as when an encoder with a 24-bit internal dynamic range processes a 32-bit float. Sometimes, however, a floating point number is smaller than the encoder's internal dynamic range. For example, an encoder with a 24-bit internal dynamic range that processes data in the popular "Half" or 16-bit floating point format does not exceed a 24-bit internal dynamic range constraint even when the floating point number is treated as an integer. This observation allows for a simpler treatment of Half data.

Figure 10:
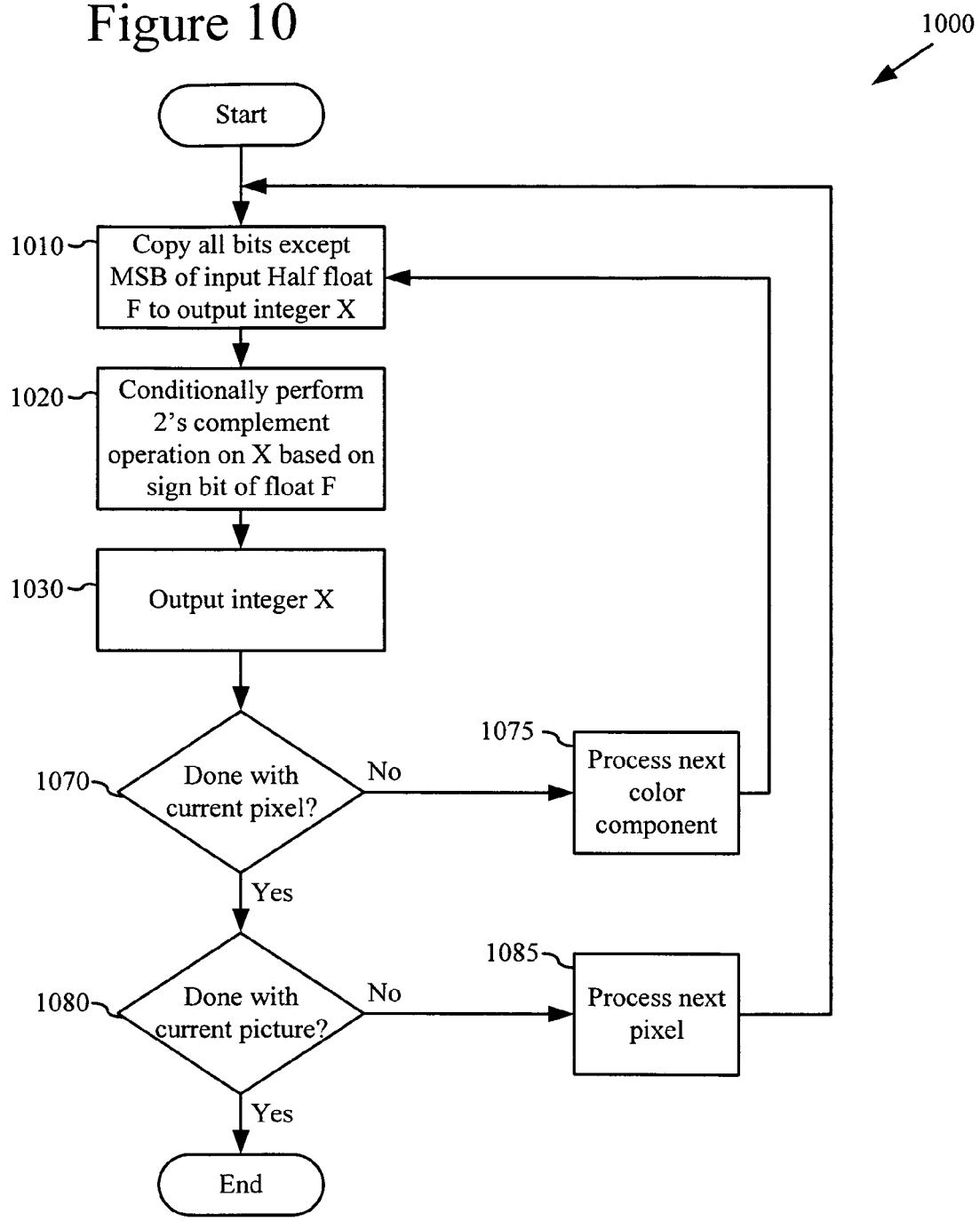
FIG. 10 is a flow chart showing a detailed technique for forward conversion of 16-bit floats to integers for a 24-bit internal dynamic range codec.
Figure 11:
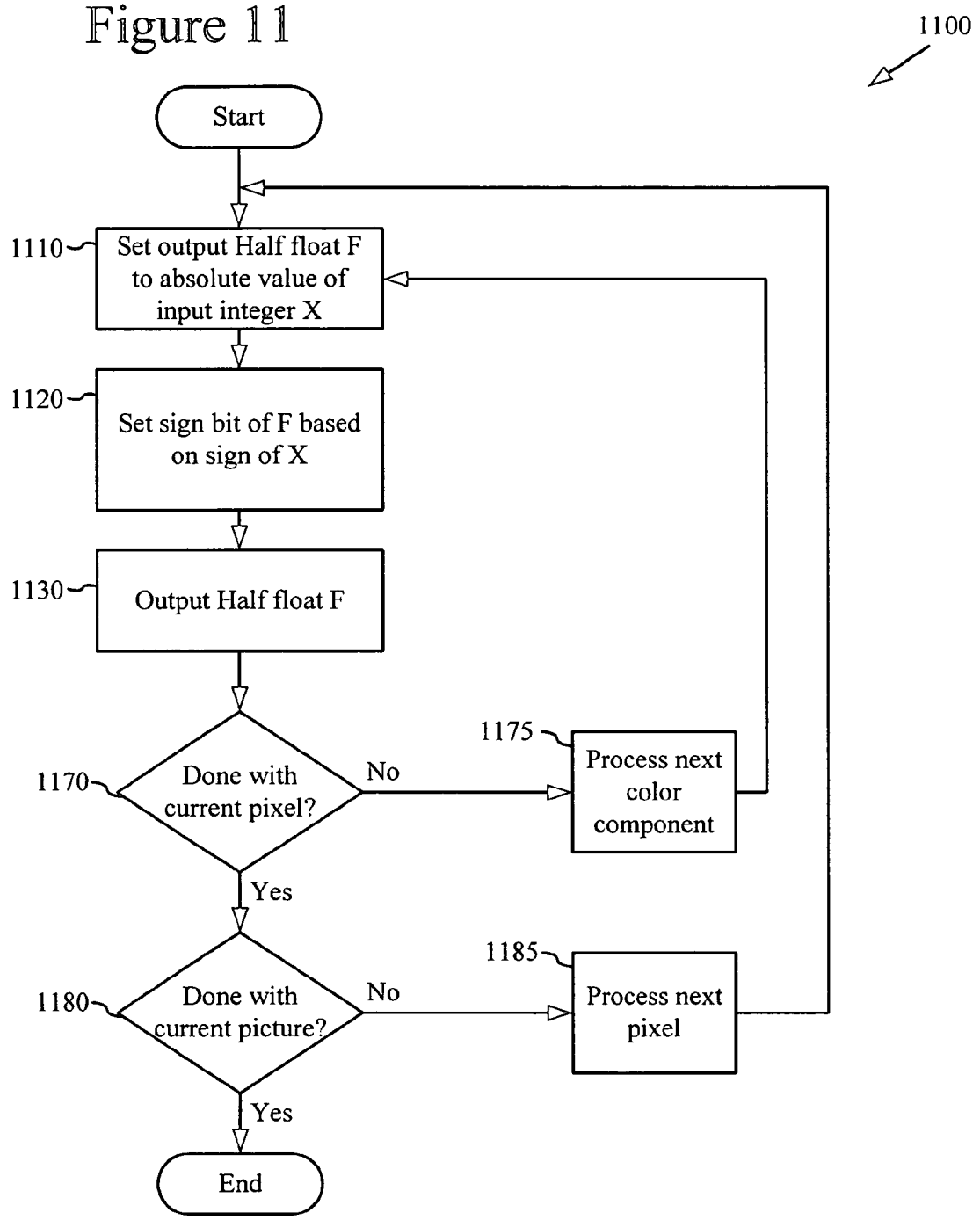
FIG. 11 is a flow chart showing a detailed technique for inverse conversion of integers in a 24-bit internal dynamic range codec to 16-bit floats.

FIGS. 10 and 11 show example techniques 1000, 1100 for forward and inverse conversion processing 16-bit floats in a 24-bit internal dynamic range codec. In the example forward conversion technique 1000, at 1010 an encoder copies all bits except the MSB from the input Half float F to the output 24-bit integer X for a color component (e.g., R, G or B), such that X=(F & 0x7fff). At 1020, the encoder conditionally performs a 2's complement on X based on the sign bit of F, which is the MSB of F. If the MSB of F is 1, the encoder sets $X=(X\hat{}(-1))+1$. Otherwise, if the sign bit of F is 0, X not changed. The encoder then outputs (1030) the forward-converted integer X.

If there are more color components to be processed in the current pixel (1070), the encoder processes the next color component at 1075. If there are no more color component to be processed in the current pixel, and if there are more pixels to be processed in the current picture (1080), the encoder processes the next pixel at 1085.

In the inverse conversion technique 1100, at 1110 a decoder preliminarily sets the output Half float F to be the absolute value of the input integer X. If F is greater than 0x7fff, the decoder sets F=0x7fff. F can be clamped to 15 bits. At 1120, based on the sign of the input integer X, the decoder sets the MSB (sign bit) of output Half float F. If X is non-negative, the decoder sets the MSB of F to 0. If X is negative, the decoder sets the MSB of F to 1. At 1130, the decoder outputs the Half float F.

If there are more color components to be processed in the current pixel (1170), the encoder processes the next color component at 1175. If there are no more color component to be processed in the current pixel, and if there are more pixels to be processed in the current picture (1180), the encoder processes the next pixel at 1185.

4. Encoding and Decoding of 32-Bit Integers

Codecs that operate with lower dynamic ranges may also need to reduce the size of higher dynamic range integers. For example, an encoder with a 24-bit internal dynamic range may not be able to handle 32-bit signed and unsigned integers without converting the 32-bit integers in some way, although reducing the size of signed and unsigned integers to fit within a smaller dynamic range may involve some loss of information.

Different techniques can be used to fit 32-bit integers (or other high dynamic range integers) to a codec that uses a 24-bit dynamic range (or some other dynamic range that is smaller than an input integer). One technique involves remapping the data to floating point. For example, it is possible to represent an entire 32 bit range by using a floating point representation with a 19-bit mantissa ($l_m$=19), a 4-bit exponent (c=7) and a sign bit, and be within a 24-bit constraint. In general, a higher number of mantissa bits implies better rate-distortion performance. In one implementation, setting $l_m$ to 19 provides better rate-distortion performance than other values of $l_m$. This technique produces a continuous, non-linear mapping. With more than 19 mantissa bits, distortions may be visible when the 32-bit range is exercised.

The inverse mapping is as follows. In order to generate the integer X represented by the float F=[s (1 bit)|e (4 bits)|m (19 bits)], first the value f of this floating point number is derived using the following equations:

$$f = (-1)^s * 2^{e-c} * (1.m) \quad \text{if } 0 < e < 15;$$

$$f = (-1)^s * 2^{-(c-1)} * (0.m) \quad \text{if } e = 0 \text{ and } m \mathrel{!}= 0;$$

$$f = 0.0 \quad \text{if } e = 0 \text{ and } m = 0;$$

$$f = INF \quad \text{if } e = 15 \text{ and } m = 0;$$

$$f = NaN \quad \text{if } e = 15 \text{ and } m \mathrel{!}= 0$$

Then, X is obtained by rounding f to an integer. Clamping can be used to restrict X to the 24-bit range.

Another technique involves a right-shift on the encoder side (and a corresponding left-shift on the decoder side) to fit within the narrower dynamic range of the codec. For example, an encoder can perform an 8-bit right-shift on a 32-bit integer at an encoder and a corresponding 8-bit left-shift at a decoder to fit a 32-bit integer in a 24-bit dynamic range. This has the advantage of being a linear mapping, but at the cost of not preserving the precision of small valued data. For differently-sized input integers or different target dynamic ranges, an encoder can perform larger or smaller bit shifts.

Figure 12:
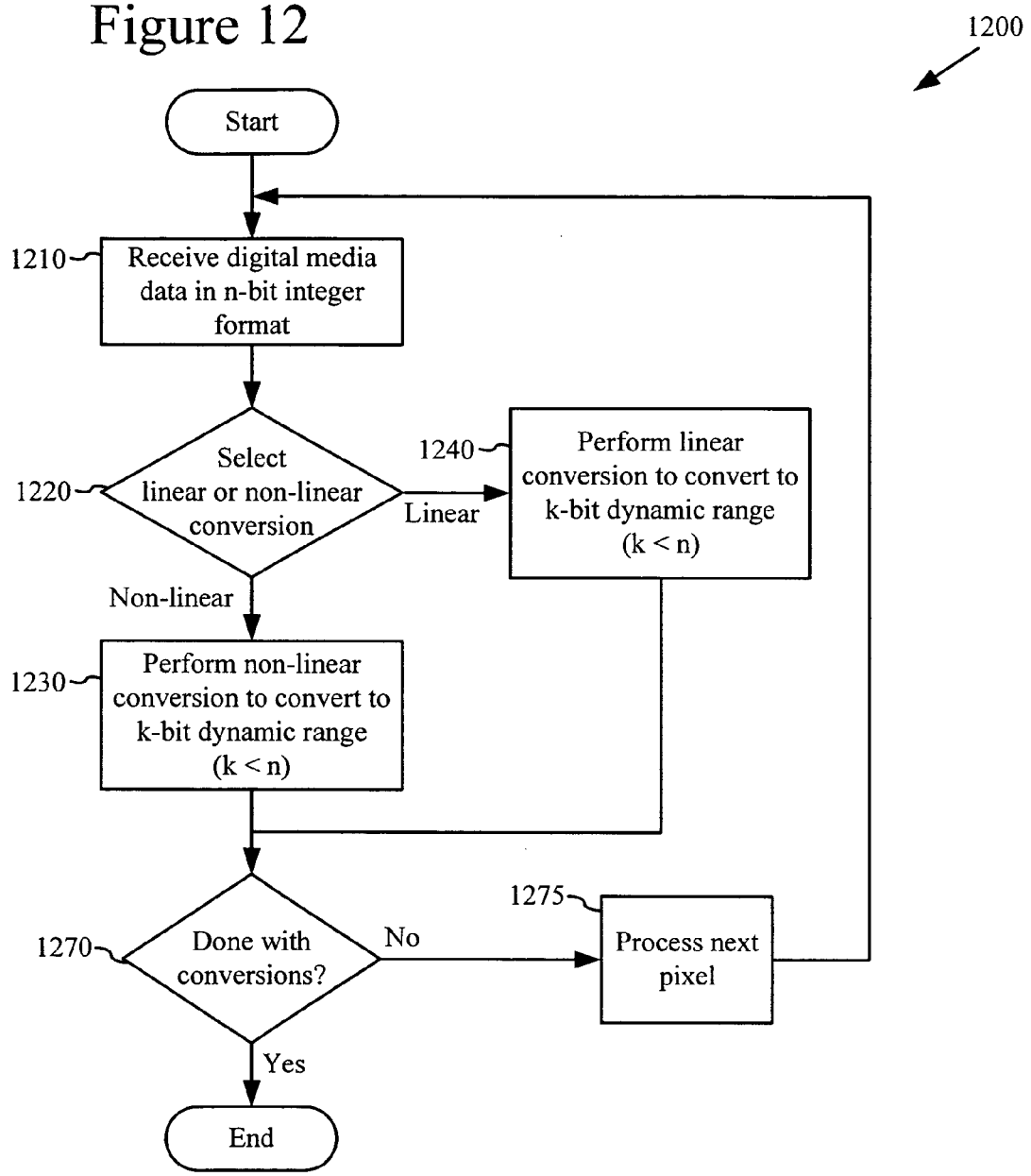
FIG. 12 is a flow chart showing a generalized technique for converting integers with higher dynamic ranges to a lower dynamic range by selecting between linear and non-linear conversion.

An encoder can choose whether to use linear conversion or non-linear conversion. FIG. 12 shows a generalized technique for converting integers with higher dynamic ranges to a lower dynamic range by selecting between linear and non-linear conversion. For example, referring to FIG. 12, an encoder receives digital media data in an n-bit integer format at 1210. The encoder selects between a linear conversion and a non linear conversion at 1220. If non-linear conversion is selected, the encoder performs non-linear conversion (1230) on the input integer to reduce the dynamic range of the input integer to a lower dynamic range. For example, the encoder converts the n-bit integer to a k-bit floating point format corresponding the dynamic range of the encoder, where k<m. If linear conversion is selected, the encoder performs linear conversion (1240) to reduce the dynamic range of the input integer. For example, the encoder performs a right shift of an appropriate number of bits to reduce the dynamic range. If there are more input integers to be processed (1270), the encoder processes the next input integer at 1275.

5. Signaling for Data Format Conversions

An encoder can insert symbols in an encoded bitstream to indicate information relating to data format for conversions. The information can be compressed in various ways (e.g., with a variable-length or fixed-length code selected from one or more code tables). An encoder can signal which source formats are being converted, which conversion techniques are being used, and other data relating to conversions.

Figure 13:
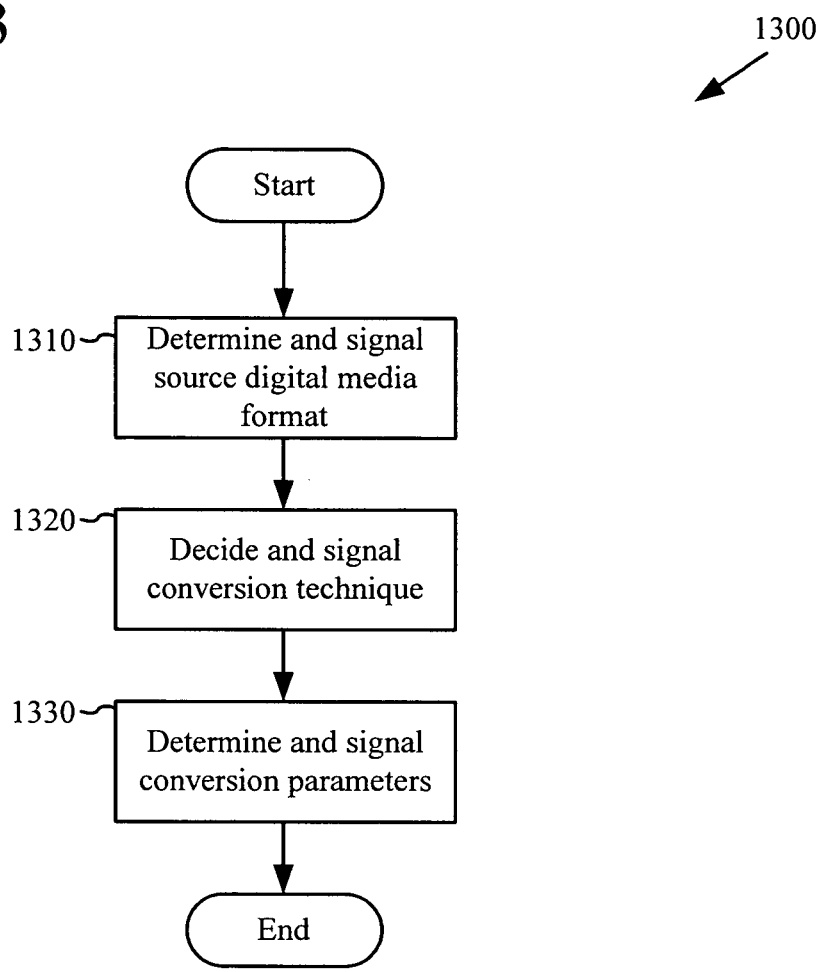
FIG. 13 is a flow chart showing a detailed technique for signaling data format conversion information in an encoded bitstream.

For example, an encoder signals coding parameters according to the example technique 1300 shown in FIG. 13. The encoder determines the source digital media format and signals the source digital media format (e.g., a still image pixel data format) at 1300. The signaling of the source format can involve sending a fixed or variable-length code from a code table comprising codes assigned to a predefined set of formats. For example, an encoder can choose between unsigned 8-bit integer, signed 10-bit integer, signed 12-bit integer, signed 32-bit integer, unsigned 32-bit integer, RGBE, 16-bit float, and 32-bit float.

The encoder makes one or more conversion technique decisions (e.g., based on the source pixel format and/or other information). The encoder can signal conversion technique decisions, if needed, at 1320. For example, the encoder can choose to whether to perform an abbreviated floating point conversion (e.g., choosing abbreviated treatment if the source pixel format is 16-bit float, and choosing other floating point treatment if the source pixel format is 32-bit float). As another example, the encoder can choose between linear and non-linear conversion techniques (e.g., for converting 32-bit integers to a 24-bit dynamic range).

The encoder also may signal additional parameters for the conversion at 1330. For example, if the source pixel format is a floating point format or if the selected conversion method is a nonlinear conversion method for HDR integers, the encoder can signal exponent bias and mantissa-length parameters (c and $l_m$). If the selected conversion method is a linear conversion method, the encoder can signal pre/post scale or bit-shift parameters in the bitstream.

Different parameters and encoding decisions can be signaled explicitly or implicitly, individually or jointly. For example, a conversion technique decision can be signaled jointly with a source format, or a conversion technique decision can be determined implicitly by a decoder based on the source format or the presence of certain conversion parameters in the bitstream. The encoder can change conversion techniques and/or signal changes in source format for different parts of the source data and signal such changes in the bitstream.

A decoder parses the encoded bitstream and performs inverse conversion. For example, the decoder decodes conversion decisions and decodes additional parameters if the encoder has provided them in order to perform the inverse conversion.

More signaling details are provided below in Section III.

C. Extensions

Although this detailed description describes examples with reference to specific input formats (e.g., RGBE, 32-bit floating point, 16-bit floating point, and 32-bit integer formats) and specific codecs (e.g., a codec with a 24-bit dynamic range), the techniques presented here can be applied widely. In particular, several currently used and future bit depths and data formats can be accommodated, with straightforward modifications to the algorithms presented here. Also, these algorithms can be used in a wide variety of current and future codecs. When using these algorithms with different codecs, the additional signaling parameters may be sent by means of a secondary channel, as side information, as metadata, and/or at different bitstream levels (e.g., a container level). This form of signaling allows these techniques to be used with different codecs and comply with different bitstream formats.

III. Example Encoder and Bitstream Syntax and Semantics

An example still image encoder/decoder and bitstream syntax and semantics that can be used in combination with described techniques and tools are now described. For example, the bitstream syntax and semantics described below can be used by an encoder to encode a still image based on a variety of input formats.

The details provided in this section are only examples. Other encoders/decoders can implement described tools and perform described techniques in other ways.

The example encoder/decoder includes support for a wide range of pixel formats including:

Monochrome, RGB, CMYK or n-Channel image representation 8 or 16-bit unsigned integer 16 or 32-bit signed integer 16 or 32-bit floating point Several packed bit formats 1 bpc monochrome 5 or 10 bpc RGB RGBE Radiance A. Compression Algorithm Overview The example encoder/decoder provides native support for both RGB and CMYK, providing a reversible color transform for each of these color formats to an internal luminance-dominant format used for optimal compression efficiency. In addition the example encoder/decoder supports YUV, monochrome and arbitrary n-channel color formats.

Because the transforms employed are fully reversible, the codec supports both lossless and lossy operation using a single algorithm. This significantly simplifies the implementation for embedded applications.

The example encoder/decoder supports a wide range of popular numerical encodings at multiple bit depths. 8-bit and 16-bit formats, as well as some specialized packed bit formats are supported for both lossy and lossless compression. 32-bit formats are supported using lossy compression; only 24 bits are typically retained through the various transforms designed to achieve maximum compression efficiency. While the example encoder/decoder uses integer arithmetic exclusively for its internal processing, an innovative color transform process provides lossless encoding support for both fixed and floating point image information. This also enables extremely efficient conversion between different color formats as part of the encode/decode process.

A file for the example encoder/decoder is defined by a container and an elementary bitstream. This nomenclature is consistent with container and elementary bitstream definitions for audio and video content. The container is a higher level structure that contains one or more elementary bitstreams, plus descriptive metadata. Each elementary bitstream defines an image. The container further contains information about each image, annotation, metadata, audio data, and definition of relationship between images.

The elementary bitstream is generally created by an encoder that operates on an input image. Further, the elementary bitstream is intended for consumption by a decoder, which reconstructs the input image or an approximation thereof. Although the bitstream is fully described by describing the decoder, this specification defines both the encoder and decoder operations. It is understood that the encoder may choose among multiple possibilities in encoding an image, and each elementary bitstream may reconstruct to a different approximation of the input.

B. Precision and Word Length

The example encoder/decoder performs integer operations. Further, the example encoder/decoder supports lossless encoding and decoding. Therefore, the primary machine precision required by the example encoder/decoder is integer.

However, integer operations defined in the example encoder/decoder lead to rounding errors for lossy coding. These errors are small by design, however they cause drops in the rate distortion curve. For the sake of improved coding performance by the reduction of rounding errors, the example encoder/decoder defines a secondary machine precision. In this mode, the input is pre multiplied by 8 (i.e. left shifted by 3 bits) and the final output is divided by 8 with rounding (i.e. right shifted by 3 bits). These operations are carried out at the front end of the encoder and the rear end of the decoder, and are largely invisible to the rest of the processes. Further, the quantization levels are scaled accordingly such that a stream created with the primary machine precision and decoded using the secondary machine precision (and vice versa) produces an acceptable image.

The secondary machine precision cannot be used when lossless compression is desired. The machine precision used in creating a compressed file is explicitly marked in the header.

The secondary machine precision is equivalent to using scaled arithmetic in the codec, and hence this mode is referred to as Scaled. The primary machine precision is referred to as Unscaled.

The example encoder/decoder is designed to provide good encoding and decoding speed. A design goal of the example encoder/decoder is that the data values on both encoder and decoder do not exceed 16 signed bits for an 8 bit input. (However, intermediate operation within a transform stage may exceed this figure.) This holds true for both modes of machine precision.

Conversely, when the secondary machine precision is chosen, the range expansion of the intermediate values is by 8 bits. Since the primary machine precision avoids a pre-multiplication by 8, its range expansion is 8−3=5 bits.

The example encoder/decoder uses two different word lengths for intermediate values. These word lengths are 16 and 32 bits.

C. Bitstream Layout

The bitstream is hierarchical and is comprised of the following layers: Image, Tile, Macroblock and Block.

TABLE 1

Image layer
Image (IMAGE) (Variable size)

| IMAGE ( ){ | Num bits | Descriptor |
|---|---|---|
| IMAGE_HEADER | Variable | struct |
| iPlane = 0 | | |
| IMAGE_PLANE_HEADER | Variable | struct |
| If (ALPHACHANNEL_PRESENT) { | | |
|     iPlane = 1 | | |
|     IMAGE_PLANE_HEADER | Variable | Struct |
| } | | |
| if( INDEXTABLE_PRESENT_FLAG !=0) { | | |
|     INDEXTABLE_STARTCODE | 16 | |
|     for (n = 0; n < NumberIndexTableEntries; n++) { | | |
|         INDEX_OFFSET_TILE[n] | VLWEsc | uimsbf |
|     } | | |
| } | | |
| HEADER_SIZE | VLWEsc | |
| FLUSH_BYTE | Variable | |
| for (n = 0; n < NumberIndexTableEntries; n++) { | | |
|     TILE(n) | Variable | struct |
| } | | |
| } | | |

TABLE 2

Image Header layer
Image Header (IMAGE_HEADER)

| IMAGE_HEADER ( ){ | Num bits | Descriptor |
|---|---|---|
| GDISIGNATURE | 64 | uimsbf |
| PROFILE | 4 | uimsbf |
| LEVEL | 4 | uimsbf |
| TILING_FLAG | 1 | uimsbf |
| BITSTREAMFORMAT | 3 | uimsbf |
| ORIENTATION | 3 | uimsbf |
| INDEXTABLE_PRESENT_FLAG | 1 | uimsbf |
| OVERLAP | 2 | uimsbf |
| SHORT_HEADER_FLAG | 1 | uimsbf |
| LONG_WORD_FLAG | 1 | uimsbf |
| WINDOWING_FLAG | 1 | uimsbf |
| TRIM_FLEXBITS_FLAG | 1 | uimsbf |
| TILE_STRETCH_FLAG | 1 | uimsbf |
| RESERVED | 2 | uimsbf |
| ALPHACHANNEL_FLAG | 1 | uimsbf |
| SOURCE_CLR_FMT | 4 | uimsbf |
| SOURCE_BITDEPTH | 4 | uimsbf |
| If (SHORT_HEADER_FLAG) { | | |
|     WIDTH | 16 | uimsbf |
|     HEIGHT | 16 | uimsbf |
| } | | |
| Else { | | |
|     WIDTH | 32 | uimsbf |
|     HEIGHT | 32 | uimsbf |
| } | | |
| if (TILING_FLAG) { | | |
|     NUM_VERT_TILES_MINUS1 | 12 | uimsbf |
|     NUM_HORIZ_TILES_MINUS1 | 12 | uimsbf |
| } | | |
| for (n = 0; n <= NUM_VERT_TILES_MINUS1; n++) { | | |
|     If(SHORT_HEADER_FLAG) | | |
|         WIDTH_IN_MB_OF_TILEI[n] | 8 | uimsbf |
|     else | | |
|         WIDTH_IN_MB_OF_TILEI[n] | 16 | uimsbf |
| } | | |
| for (n = 0; n < NUM_HORIZ_TILES_MINUS1; n++) | | |
|     If (SHORT_HEADER_FLAG) | | |
|         HEIGHT_IN_MB_OF_TILEI[n] | 8 | uimsbf |
|     else | | |
|         HEIGHT_IN_MB_OF_TILEI[n] | 16 | uimsbf |
| } | | |
| if (WINDOWING_FLAG) { | | |
|     NUM_TOP_EXTRAPIXELS | 6 | uimsbf |
|     NUM_LEFT_EXTRAPIXELS | 6 | uimsbf |
|     NUM_BOTTOM_EXTRAPIXELS | 6 | uimsbf |
|     NUM_RIGHT_EXTRAPIXELS | 6 | uimsbf |
| } | | |
| FLUSHBYTE | Variable | |
| } | | |

TABLE 3

Image Plane Header layer

| IMAGE PLANE HEADER ( ){ | Num bits | Descriptor |
|---|---|---|
| CLR_FMT | 3 | uimsbf |
| NO_SCALED_FLAG | 1 | uimsbf |
| BANDS_PRESENT | 3 | uimsbf |
| if (CLR_FMT == 'YUV_444') { | | |
|     CHROMA_CENTERING | 4 | uimsbf |
|     COLOR_INTERPRETATION | 4 | uimsbf |
| } else if (CLR_FMT == 'N_CHANNEL') { | | |
|     NUM_CHANNELS_MINUS1 | 4 | uimsbf |
|     COLOR_INTERPRETATION | 4 | uimsbf |
| } | | |
| if (SOURCE_CLR_FMT == 'BAYER') { | | |
|     BAYER_PATTERN | 2 | uimsbf |
|     CHROMA_CENTERING_BAYER | 2 | uimsbf |
|     COLOR_INTERPRETATION | 4 | uimsbf |
| } | | |
| if (SOURCE_BITDEPTH == '32' \|\| SOURCE_BITDEPTH == '32S') { | | |
|     SHIFT_BITS | 8 | uimsbf |
| } | | |
| if (SOURCE_BITEPTH == '32F') { | | |
|     MANTISSA | 8 | uimsbf |
|     EXPBIAS | 8 | uimsbf |
| } | | |

TABLE 3-continued

Image Plane Header layer

| IMAGE PLANE HEADER ( ){ | Num bits | Descriptor |
|---|---|---|
|   DC_FRAME_UNIFORM | 1 | uimsbf |
|   if (DC_FRAME_UNIFORM) | | |
|     DC_QUANTIZER( ) | variable | struct |
|   If(BANDS_PRESENT != 'SB_DC_ONLY'){ | | |
|     USE_DC_QUANTIZER | 1 | uimsbf |
|     if(USE_DC_QUANTIZER == FALSE){ | | |
|       LP_FRAME_UNIFORM | 1 | uimsbf |
|       If(LP_FRAME_UNIFORM){ | | |
|         NUM_LP_QUANTIZERS = 1 | | |
|         LP_QUANTIZER( ) | variable | struct |
|       } | | |
|     } | | |
|     if(BANDS_PRESENT != 'SB_NO_HIGHPASS'){ | | |
|       USE_LP_QUANTIZER | 1 | uimsbf |
|       if(USE_LP_QUANTIZER == FALSE){ | | |
|         HP_FRAME_UNIFORM | 1 | uimsbf |
|         If(HP_FRAME_UNIFORM){ | | |
|           NUM_HP_QUANTIZERS = 1 | | |
|           HP_QUANTIZER( ) | variable | struct |
|         } | | |
|       } | | |
|     } | | |
|   } | | |
|   FLUSHBYTE | Variable | |
| } | | |

Some selected bitstream elements are defined below.

Source Color Format (SOURCE_CLR_FMT) (4 bits)

SOURCE_CLR_FMT a 4-bit syntax element and specifies the color format of the source image as defined below.

TABLE 4

Color Format of Source Image

| SOURCE_CLR_FMT | Meaning of Source Color Format |
|---|---|
| 0 | Y_ONLY |
| 1 | YUV_420 |
| 2 | YUV_422 |
| 3 | YUV_444 |
| 4 | CMYK |
| 5 | BAYER |
| 6 | N-CHANNEL |
| 7 | RGB |
| 8 | RGBE |
| 9 | PALLETIZED |
| 10-15 | Reserved |

If (iPlane==1), the value of SOURCE_CLR_FMT is equal to 0.

Source Bit Depth (SOURCE_BITDEPTH) (4 bits)

SOURCE_BITDEPTH is a 4-bit syntax element and specifies the bit depth of the source image, as defined below.

TABLE 5

Color Format of Source Image

| SOURCE_BITDEPTH | Meaning of Source Bit Depth |
|---|---|
| 0 | BD_1 |
| 1 | BD_8 |
| 2 | BD_16 |
| 3 | BD_16S |
| 4 | BD_16F |
| 5 | BD_32 |
| 6 | BD_32S |
| 7 | BD_32F |

TABLE 5-continued

Color Format of Source Image

| SOURCE_BITDEPTH | Meaning of Source Bit Depth |
|---|---|
| 8 | BD_5 |
| 9 | BD_10 |
| 10-15 | Reserved |

Color Format (CLR_FMT) (3 bits)

CLR_FMT is a 3-bit syntax element that specifies the internal color format of the coded image as defined below.

TABLE 6

Color Format

| CLR_FMT | Meaning of Color Format |
|---|---|
| 0 | Y_ONLY |
| 1 | YUV_420 |
| 2 | YUV_422 |
| 3 | YUV_444 |
| 4 | CMYK |
| 5 | BAYER |
| 6 | N-CHANNEL |
| 7 | Reserved |

Number of Channels (NUM_CHANNELS_MINUS1) (4 bits)

NUM_CHANNELS_MINUS1 is a 4-bit syntax element present only if CLR_FMT=="N_CHANNEL".

The number of channels, NChannels, is defined according to the following pseudocode:

```
If (CLR_FMT == 'N_CHANNEL')
    NChannels = NUM_CHANNELS_MINUS1 + 1
Else if (CLR_FMT== Y_ONLY)
    NChannels = 1
Else If (CLR_FMT ==YUV_420 || CLR_FMT ==
```

```
      YUV_422 || CLR_FMT == YUV_422)
        NChannels = 3
    Else // (CLR_FMT == CMYK || CLR_FMT == BAYER),
        NChannels = 4
```

Pre/post Shift Bits (SHIFT_BITS)(8 bits)

SHIFT_BITS is an 8-bit syntax element that is present only if (SOURCE_BITDEPTH=='32' || SOURCE_BITDEPTH=='32S') and specifies the number of bits by which to left-shift the reconstructed data.

Length of Mantissa (MANTISSA) (8 bits)

MANTISSA is an 8-bit syntax element that is present only if (SOURCE_BITDEPTH=='32F'). It species the number of mantissa bits in the encoding of floating point data.

Exponent Bias (EXPBIAS) (8 bits)

EXPBIAS is an 8-bit syntax element that is present only if (SOURCE_BITDEPTH=='32F'). This element specifies the bias of the exponent in the encoding of floating point data.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A method for encoding digital media comprising:
   by a computing device configured to implement the method, receiving digital media data in a first format, the digital media data in the first format including a plurality of still image sample values that collectively form a still image, each of the plurality of sample values of the digital media data in the first format comprising a sign bit, an exponent and a mantissa having a first bit length;
   by the computing device configured to implement the method, converting the still image sample values from the first format to a second format, including, for each of the plurality of still image sample values, obtaining a scaled exponent by scaling the exponent for the sample value with a specified exponent bias value and adjusting the bit length of the mantissa to a second bit length different from the first bit length, the digital media data in the second format having a different dynamic range than the first format, each of the plurality of sample values of the digital media data in the second format comprising the scaled exponent scaled by the specified exponent bias value, the mantissa for the sample value, and no separate sign bit;
   by the computing device configured to implement the method, encoding the converted still image sample values; and
   by the computing device configured to implement the method, generating a bitstream comprising the encoded still image sample values, a first bitstream syntax element that indicates the exponent bias value for the encoded still image sample values, a second bitstream syntax element that indicates the second bit length of the mantissa, and a third bitstream syntax element that indicates the first format from among multiple possible source formats and that indicates the bit depth and format type using a single syntax element, wherein the first bitstream syntax element, the second bitstream syntax element, and the third bitstream syntax element are part of the image header layer of the bitstream.

2. The method of claim 1 wherein the second bit length is shorter than the first bit length.

3. The method of claim 1 wherein the second bit length is longer than the first bit length.

4. The method of claim 1 wherein the adjusting the bit length of the mantissa to a second bit length is based on an adjustable mantissa length conversion parameter.

5. The method of claim 4, wherein the exponent bias value is based on an adjustable exponent bias value conversion parameter.

6. The method of claim 4, wherein the digital media data in the first format is high dynamic range (HDR) image data.

7. The method of claim 1 further comprising, based on the sign bit, performing a 2's complement operation as part of the converting.

8. The method of claim 1 further comprising decoding the encoded still image sample values at a digital media decoder.

9. The method of claim 1 wherein the first and second bitstream syntax elements are only included in the bitstream when the third syntax element indicates that the source image has a floating point format.

10. The method of claim 1, wherein the specified exponent bias value is specified by a user.

11. The method of claim 1, wherein the encoding the converted still image sample values further comprises (a) performing a scaling operation to reduce rounding errors during intermediate encoding operations by multiplying the still image sample values at a front end of the encoder; (b) performing the intermediate operations on the scaled still image sample values; and (c) dividing final values by an amount corresponding to the multiplying, and
   wherein the generating the bitstream further comprises generating a fourth syntax element indicating whether scaling was performed.

12. A computer-readable storage medium storing computer-executable instructions for performing a method, the method comprising:
   receiving digital media data in a first format, the digital media data in the first format including a plurality of still image sample values, each of the plurality of still image sample values of the digital media data in the first format comprising a sign bit, an exponent and a mantissa having a first bit length;
   converting the still image sample values from the first format to a second format, including, for each of the plurality of still image sample values, obtaining a scaled exponent by scaling the exponent for the sample value with a specified exponent bias value and adjusting the bit length of the mantissa to a second bit length different from the first bit length, the digital media data in the second format having a different dynamic range than the first format, each of the plurality of sample values of the digital media data in the second format consisting of the scaled exponent scaled by the specified exponent bias value and the mantissa for the sample value;
   encoding the converted still image sample values; and
   generating a bitstream comprising the encoded still image sample values, a first bitstream syntax element that indicates the exponent bias value for the encoded still image sample values, a second bitstream syntax element that indicates the second bit length of the mantissa, and a third bitstream syntax element that indicates the first format from among multiple possible source formats and that indicates the bit depth and format type using a single syntax element, wherein the first bitstream syntax element, the second bitstream syntax element, and the third bitstream syntax element are part of the image header layer of the bitstream.

13. The computer-readable storage medium of claim 12, wherein the second bit length is shorter than the first bit length.

14. The computer-readable storage medium of claim 12, wherein the second bit length is longer than the first bit length.

15. The computer-readable storage medium of claim 12, wherein the adjusting the bit length of the mantissa to a second bit length is based on an adjustable mantissa length conversion parameter.

16. The computer-readable storage medium of claim 12, wherein the method further comprises, based on the sign bit, performing a 2's complement operation prior to outputting encoded digital media data.

17. The computer-readable storage medium of claim 12, wherein the exponent bias value is based on an adjustable exponent bias value conversion 18. The computer-readable storage medium of claim 12, wherein the bitstream further includes a bitstream syntax element indicating a color format of a source image.

19. The computer-readable storage medium of claim 12 wherein the first and second bitstream syntax elements are only included in the bitstream when the third syntax element indicates that the source image has a floating point format.

20. The computer-readable storage medium of claim 12, wherein the specified exponent bias value is specified by a user.

21. The computer-readable storage medium of claim 12, wherein the digital media data in the first format is high dynamic range (HDR) image data.

22. The computer-readable storage medium of claim 12, wherein the encoding the converted still image sample values further comprises (a) performing a scaling operation to reduce rounding errors during intermediate encoding operations by multiplying the still image sample values at a front end of the encoder; (b) performing the intermediate encoding operations on the scaled still image sample values; and (c) dividing final values by an amount corresponding to the multiplying, and wherein the generating the bitstream further comprises generating a fourth syntax element indicating whether scaling was performed.

23. A method for decoding digital media comprising:
by a computing device configured to implement the method, receiving a bitstream comprising encoded still image sample values, a first bitstream syntax element that indicates the exponent bias value for the encoded still image sample values, a second bitstream syntax element that indicates a first bit length of the mantissa, and a third bitstream syntax element that indicates a second format from among multiple possible formats and that indicates the bit depth and format type of the second format using a single syntax element, wherein the first bitstream syntax element, the second bitstream syntax element, and the third bitstream syntax element are part of the image header layer of the bitstream;

by the computing device configured to implement the method, decoding the encoded still image sample values into still image sample values in a first format; and by the computing device configured to implement the method, converting the still image sample values in the first format into still image sample values in the second format using the first bitstream syntax element, the second bitstream syntax element, and the third bitstream syntax element, each of the still image sample values in the first format comprising a scaled exponent scaled by the exponent bias value specified by the first bitstream syntax element, a mantissa having the first bit length specified by the second bitstream syntax element, and no separate sign bit, each of the still image sample values in the second format comprising a sign bit, an exponent having the exponent bias value removed, and a mantissa having a second length.

24. The method of claim 23, wherein the receiving further comprises receiving a bitstream syntax element indicating a bit depth and format, and wherein the existence of the bitstream syntax element indicating the exponent bias value in the bitstream is dependent on the bitstream syntax element indicating the bit depth.

25. The method of claim 24, wherein the bitstream syntax element indicating a bit depth indicates a bit depth of 32 bits, and wherein each of the still image sample values in the second format comprise 32-bit floats.

26. The method of claim 23, wherein the still image sample values in the second format comprise high dynamic range (HDR) image data.

27. The method of claim 23, wherein the bitstream further comprises a fourth syntax element indicating whether scaling is to be performed; and wherein the decoding comprise, when the fourth syntax element indicates that scaling is to be performed: (a) performing a scaling operation to reduce rounding errors during intermediate decoding operations by multiplying the still image sample values at a front end of the decoder; (b) performing the intermediate decoding operations on the scaled still image sample values; and (c) dividing final decoder values by an amount corresponding to the multiplying.

* * * * *